United States Patent [19]

Mortimer

[11] Patent Number: 4,769,818
[45] Date of Patent: Sep. 6, 1988

[54] METHOD AND APPARATUS FOR CODING DIGITAL DATA TO PERMIT CORRECTION OF ONE OR TWO INCORRECT DATA PACKETS (BYTES)

[75] Inventor: Brian C. Mortimer, Ottawa, Canada

[73] Assignee: Canadian Patents and Development Limited-Societe Canadienne Des Brevets et d'Exploitation Limitee, Ottawa, Canada

[21] Appl. No.: 933,758

[22] Filed: Nov. 21, 1986

Related U.S. Application Data

[63] Continuation-in-part of Ser. No. 615,132, May 30, 1984, abandoned.

[51] Int. Cl.[4] ............................................. G06F 11/10
[52] U.S. Cl. .................................................... 371/37
[58] Field of Search ........................ 371/37, 38, 39, 40, 371/50

[56] References Cited

U.S. PATENT DOCUMENTS

| | | | |
|---|---|---|---|
| 3,893,071 | 7/1975 | Bossen et al. | 371/38 |
| 4,330,860 | 5/1982 | Wada et al. | 371/37 |
| 4,336,612 | 6/1982 | Inoue et al. | 371/39 |
| 4,398,292 | 8/1983 | Doi et al. | 371/39 |
| 4,447,902 | 5/1984 | Wilkinson | 371/39 |
| 4,495,623 | 1/1985 | George et al. | 371/38 |

Primary Examiner—Charles E. Atkinson
Attorney, Agent, or Firm—Woodcock Washburn Kurtz Machiewicz & Norris

[57] ABSTRACT

A method of, and apparatus for, encoding and decoding a sequence of data bytes to permit correction of bit errors occurring in one byte of the sequence, or two bytes providing that the two incorrect bytes can be identified (for example if the bytes show parity failure). Each data byte of the sequence comprises data bits and one parity check bit. To encode the sequence of data bytes two "Code C" code bytes are determined from the data bytes, according to predetermined relationships, the data bytes and code bytes together forming an encoded data block. Also, there is provided a method of, and apparatus for, encoding and decoding a bundle of data blocks to permit correction of a number of bit errors occurring in bytes of the bundle. (Conceptually, the bundle of data blocks comprises a stack of data blocks, one positioned under another to form a two dimensional array of bytes.) Data block bundle encoding consists of separately encoding rows (i.e. horizontal encoding) and columns or pairs of columns (i.e. vertical encoding) of bytes of the bundle array with two "Code C" code bytes.

12 Claims, 13 Drawing Sheets

METHOD AND APPARATUS FOR CODING DIGITAL DATA TO PERMIT CORRECTION OF ONE OR TWO INCORRECT DATA PACKETS (BYTES)

RELATED APPLICATION

This application is a continuation-in-part of application Ser. No. 615,132 filed May 30, 1984, and now abandoned.

FIELD OF THE INVENTION

This invention is a method and apparatus for encoding and decoding digital data to permit the correction of any number of incorrect data bits occurring in one received data packet (e.g. data byte) of a data block consisting of a sequence of data packets, each data packet consisting of data bits and one parity check bit. In addition, any number of data bit errors occurring in two data packets may be corrected if the two data packets having errors are identified, e.g. if each of the two data packets shows incorrect parity. Both data block and data block bundle coding are provided, the latter permitting error correction of a substantial number of incorrect data packets occurring in the bundle.

BACKGROUND OF THE INVENTION

In digital data communication systems, a sequence of bits (i.e. a signal representing binary digits) originates from a transmitter and is transmitted through a communications channel to a receiver. (Usually, data bits are grouped into "packets" consisting of a predetermined number of bits. The number commonly chosen, and selected herein, is eight bits, known as a byte.) If the communications channel were perfect, the sequence of bits received at the receiver would be identical to the transmitted data bits. However, communications channels are not perfect and, because of the presence of (electromagnetic) noise and other spurious signals, some of the received data bits may very well not be the same as the transmitted data bits. Accordingly, encoding and decoding devices have been designed to permit the detection and correction of errors occurring in a sequence of received data bits. Such systems determine if some of the bits of the received data bits differ from the transmitted data bits, and thereafter correct the error or errors, as the system permits.

A ("horizontal") data block coding system and apparatus is provided by the present invention and disclosed herein, to permit the detection and correction of one or more data bit errors occurring in any one data byte of a block of data bytes (or, more generally, data packets) or, in any two data bytes of a block of data bytes (again, or, more generally, data packets) providing that the two bytes have incorrect parity and can therefore be identified. Also provided by the present invention, and disclosed herein, is a ("horizontal and vertical") data block bundle coding system and apparatus. A bundle of data blocks, comprising an array of bytes, is formed by "stacking" data blocks one under another. Bundle coding permits the detection and correction of one or more data bit errors occurring in any one data byte or, in any two data bytes (or, more generally, data packets) providing that the two bytes can be identified, of a horizontal or vertical data block of the bundle. The bundle coding system of the present invention permits the full reconstruction of a missing data block of the bundle.

Bit errors occurring in a block of received digital data, in a data communication system, such as the videotex information system, known in Canada as Telidon* (*an official mark of the Government of Canada, Ministry of Communications, for which notice has been given under Section 9(l)(n)(iii) of the Canadian Trade Marks Act) often results in noticeable and unacceptable picture distortion which, in turn, necessitates requesting, at the receiver, retransmission of that data block and waiting for some time interval before the retransmitted data block has received. Both picture distortion and retransmission delays are undesirable and may contribute to user/subscriber dissatisfaction with the data system. Consequently, it is desirable to be able to detect bit errors occurring in a block, or bundle of blocks, of received data packets and to correct the errors at the receiver. Such error correction capability allows the correction of bit errors occurring in a block of data before the errors result in picture distortion and eliminates having to wait for the reception of a retransmitted data block.

Several error correction methods are known, and many different apparatus have been developed for encoding and decoding data blocks to permit the correction of bit errors. For example, there exists a single bit error correction method, denoted the SAB code, which is described in *A Class of High Rate Codes for Byte-Oriented Information Systems,* I.E.E.E. Transactions on Communications, Vol. COM-31, No. 3, March 1983.

Another example of a coding method which enables the correction of a single bit error occurring in a block of data bytes (or, more generally, data packets) is denoted herein as the "Product Code". This coding method parity encodes a block of data bits horizontally and vertically, adding one byte of redundancy (i.e. non-data byte) to the bits. One parity bit is added to each group of bits to form data bytes of fixed parity (i.e. for horizontal parity encoding), and one parity check byte (i.e. the redundant byte) is added to each block of data bytes (i.e. for vertical parity encoding). The parity check byte or, code byte, is defined such that the sum of all data bytes, and the code byte, equals 00000000 if even parity is selected, or 11111111 if odd parity is selected. Each bit of the code byte sets the parity of the bits of the data bytes arranged vertically in the block of "stacked" data bytes. This coding method is incorporated into the coding method used in the present invention and is discussed further below.

Another example of a coding method which permits the correction of a single bit error in a block of data bits, is denoted herein as the "Carleton Code". The Carleton Code redundant byte is determined algebraically from the data bytes of the data block to be encoded, in a manner similar to the coding method (Code C) used in the present invention. Details of the Carleton Code are described in pending U.S. application Ser. No. 596,397, now U.S. Pat. No. 4,599,722 issued 7/8/86, which is for another invention of the present inventor.

The above examples of coding methods involve one byte of redundancy per block of data bytes and each enables the correction of a single bit error (being either a data or parity bit). The coding method used in the present invention involves two bytes of redundancy per block of data bytes and, preferably, one or two blocks of code bytes of redundancy for bundle coding and enables the correction of up to two incorrect data bytes for each data block. Bundle coding can provide an even greater level of data correction by repetitively decoding a bundle of data blocks. This is because error corrections made during horizontal decoding may enable additional error corrections to be made upon vertical decoding, and vice-versa. That is, horizontal and vertical decoding can be repeated, in cycles, until the desired correction level is attained (for example, until no further corrections are made possible by the current decoding cycle).

SUMMARY OF THE INVENTION

A data block encoding and decoding system, suitable for use in a videotex information system, has been developed whereby two code packets (e.g. bytes), each packet comprising bits, are provided, as redundancy, for each block of data packets. Each data packet and code packet is provided with one parity bit. The code used in the present invention is herein denoted Code C. The method of data block coding, used in the present invention, is alternatively referred to herein, as horizontal coding.

In addition to, and expanding upon, the data block coding system, a bundle coding system has been developed whereby data blocks are (conceptually) "stacked" one under another to form an array of data packets. Vertically associated packets of the bundle are encoded, i.e. vertical encoding, with two code packets (e.g. bytes), as redundancy for the data packets of the vertical group, according to Code C. Either one or two code blocks are appended to the data blocks, the data blocks and code blocks forming a bundle. If only one code block of redundancy is selected, two columns of vertically associated data packets (i.e. columns of the bundle array), are encoded together as one vertical data block and the two code packets for the block are appended to the block, one below each column. If two code blocks of redundancy are selected, each column of vertically associated data packets is encoded and the two code packets are appended below the vertical group, one in each code block, the encoded column forming one vertical data block.

The non-parity bits of each code packet (e.g. the least significant bits), are determined according to predetermined algebraic relationships according to Code C, herein defined, between the data packets. Each code packet also contains one parity bit (e.g. the most significant bit) which sets the parity of the code packet to the selected parity of the data packets. If the parity bits of the data packets are to be included in the determination of the code packets the code packets are not allocated a parity bit and, therefore, are not parity encoded.

The Code C method of encoding enables the correction of bit errors occurring in one data packet of a block of data, or two packets if the packets can be identified. Bundle coding utilizes Code C to encode data blocks arranged in a "bundle" to form an array of packets, each vertical and horizontal block of packets being encoded according to Code C. Bundle coding permits the correction of a greater number of error packets than data block encoding alone enables. For example, one lost data block of a bundle can be completely reconstructed using bundle coding, providing that the arrangement of error packets in the bundle conforms to the (known) limitations of the coding method.

Definitions

Before providing a summary of the invention, it will be helpful, to ensure consistency, to define some of the terminology employed in the disclosure and claims.

1. A "bit" is a binary digit and has one or other of two values, for example, a bit may be either 0 or 1.
2. A "data packet" is a sequence of a fixed number of bits. The well-known term "byte" is a data packet having 8 bits and is selected for the system herein disclosed. Equally, with some straightforward modification of the methods and apparatus herein disclosed, a data packet could be selected having, for example, 5, 9, 16 or 87 bits. (A word of caution is in order; the term "packet" is used herein according to the definition above and does not mean, or have any relationship to, the 33 byte packet used in the Telidon* nomenclature.)
3. A block of data packets is a sequence of a fixed number of data packets. For the system described herein, a packet is a byte and each block of data packets, or, in the case of bundle coding, each horizontal block of data packets, consists of 28 bytes, 26 bytes being data bytes and 2 bytes being code bytes comprising one code word.
4. A bundle of data blocks consists of a fixed number of data blocks. For convenience, and to facilitate understanding of the bundle coding method used in the present invention, a bundle of data blocks may be visualized conceptually as a stack of data blocks, arranged one under another, the packets of each block aligned so as to form an array of packets. Data blocks so stacked are herein referred to as rows of the bundle or, alternatively, as horizontal data blocks. The columns of packets of the array to be encoded are herein referred to as columns of the bundle, or, alternatively, as vertical data blocks. For the system herein disclosed, a data block bundle consists of h (horizontal) data blocks i.e. h rows. In one embodiment of the present invention for bundle coding, the hth data block consists wholly of code bytes for the columns of bytes of the bundle. In another embodiment of the present invention, also for bundle coding, the h-1th and hth data blocks both consist wholly of code bytes for the columns of bytes of the bundle.
5. A parity check bit is an extra (i.e. redundant) bit, placed at a predetermined location in a sequence of bits, for example in a byte, and is used for error detection. Suppose that a sequence of 7 bits are to be parity encoded, with one parity bit, to form a parity encoded data byte. To do so, a parity bit is appended to the 7 data bits, the value of the parity bit being determined by the desired number of 1's in the byte. As an example, if it is desired that all data bytes have an odd number of 1's, (i.e. if odd parity is desired), the parity check bit is set to 0 or 1, depending upon the number of 1 data bits. The parity check bit is 0 if there are an odd number of 1 data bits, and 1 if there are an even number of 1 data bits. Thus, a parity encoded data byte consists of 7 data bits and 1 parity check bit. Inclusion of a parity check bit permits the identification of a received packet (e.g. byte) having an odd number of bit errors, since an odd number of bit value changes occurring in a packet necessarily changes the parity of the packet. However, a parity check bit does not permit identification of the specific bits which are received in error. A greater degree of redundancy than 1 bit per byte, is required to be able to do so.
6. A "codeword", referred to herein, consists of 2 code bytes (or, more generally, packets) determined algebraically, according to predetermined relationships between data bytes which define Code C, as disclosed herein. In the system described herein, the data bytes of a data block or, in the case of bundle coding, the data bytes of a horizontal or vertical data block, determine one codeword. Therefore, each encoded data block contains one codeword.

7. "Binary addition" (or, simply "addition") referred to herein, means addition by modulo 2 arithmetic. By modulo 2 addition, $1+1=0$; $0+0=0$; $1+0=1$ and $0+1=1$. The logic function denoted "exclusive OR" effects the same operation as modulo 2 addition. For example, if two bytes, namely, 11111111 and 01010101 are added together, using binary addition, or exclusive OR'ed, the result is 10101010.

The present invention provides a data block encoding device to encode a sequence of parity encoded data packets with two code packets (i.e. with a Code C codeword) to permit the detection and correction of one incorrect packet occurring therein, or two incorrect packets if the two packets are identifiable. The device comprises identification means to identify data packets of a data block, each packet containing one parity check bit, and processing means for producing two code packets. The code packets are defined such that the sum, using modulo 2 addition, of the data packets and code packets is equal to zero and the sum of the data packets and code packets each multiplied by a particular packet representative of a unique Galois field element, is equal to zero.

The processing means includes summing means to sum, by modulo 2 addition, two packets. Multiplication means are also included for multiplying two packets together, each packet being representative of a Galois field element. Multiplication occurs within the particular Galois field over the Galois field of two elements, namely, 0 and 1. The processing means also includes generating means for producing two code packets conforming to the summations defined above and assembly means for assembling the code packets with data packets to produce an encoded data block comprising data packets and two code packets (i.e. Code C codeword).

Preferably the processing means includes a microprocessor and appropriate operating system, contained in memory, to control the microprocessor and process the data packets.

Also provided by the present invention is a data block decoding device to decode a sequence of packets of a data block, the packets encoded with two code packets (i.e. a Code C codeword), to detect incorrect packets occurring in the block and correct one or two incorrect packets (providing that the two incorrect packets can each be identified). The device comprises identification means to identify packets of the data block and processing means for producing one or two bit-error-pattern packets according to predetermined relationships between the packets of the data block. The processing means includes parity check means to determine the parity of each of the data packets of the data block. Also included is byte parity error flagging means to permit the identification of two bytes having parity failure. Summing means, by modulo 2 addition, and multiplication means are included to determine, according to predetermined relationships between the packets, one bit-error-pattern packet for one incorrect packet or two bit-error-pattern packets for two identified incorrect packets. The multiplication occurs within the particular Galois field which contains elements capable of representation by the packets, over the Galois field of two elements, namely, 0 and 1. The decoding device also comprises packet correction means to correct incorrect packets with the bit-error-pattern packets.

Preferably the processing means of the decoding device includes a microprocessor and appropriate operating system, contained in memory, to control the microprocessor and process the data and code packets.

The invention is described, by way of example, with reference to the following drawings.

DESCRIPTION OF THE INVENTION

Figure 1:
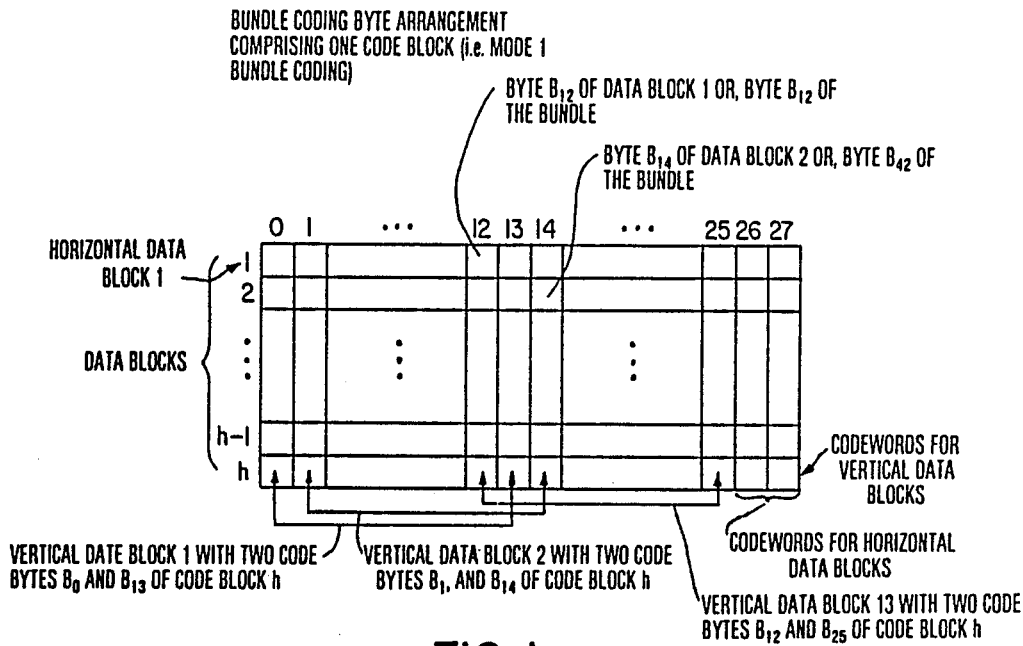
FIG. 1 illustrates, by way of pictorial representation, the arrangement of data bytes and code bytes forming an encoded data block bundle, the bundle comprising encoded data blocks and one code block.

The coding method utilized in the present invention, denoted Code C, involves a two byte (or, more generally, a two packet) codeword for redundancy. The invention and coding method are described herein, by way of example only, with respect to an embodiment thereof in which 26 data bytes are encoded to form a data block of 28 bytes, 2 bytes being code bytes determined according to Code C comprising one codeword. However, it should be recognized that the coding method utilized is general, and not specific, and the embodiment disclosed herein might be modified by one having average skill in the art, so as to apply to data packets comprising some number of bits other than 8 and/or to data blocks comprising some number of packets other than 28. The invention will now be described, by way of example only, considering data blocks consisting of 26 data bytes and 2 code bytes.

By "redundancy" (mentioned above), it is meant that the codeword does not add to the data bytes information which is intended to be received for use by an end-user. Rather, the added codeword is dependent upon, and derived from, the data bytes (the data bytes containing information intended for an end-user), and it is the resultant redundancy of information which enables the correction of errors occurring in the data bytes. The greater the number of bits of redundancy, added to the data bytes, the greater the scope will be for the correction of errors occurring in the data bits. The error correction codewords, used in the present invention, enable the accuracy of received data bytes to be improved without the necessity of retransmitting correct data.

The bits of the two bytes of a Code C codeword are defined appropriately to satisfy two conditions defined by algebraic combinations of the data bytes and code bytes of a data block. The first condition corresponds to the condition defining the Product Code, mentioned above, which requires that the addition of all bytes of an encoded data block produces an all-0 or all-1 result, depending upon the parity selected. The second condition is similar, in form, to the relationship defining a code byte of the Carleton Code, mentioned above. The Carleton Code and Code C both involve the representation of data bytes as elements of a particular finite field in order that the bytes may be manipulated according to the particular algebraic relationships defining the code while the result remains in the finite field. Given this introduction to the method of data coding, denoted Code C, a more detailed description of same follows.

Description of Code C

As mentioned above, the coding method used in the present invention, denoted herein Code C, is a two byte redundancy code. The two byte codeword, for a group of data bytes is defined by two independent conditions. The first can be described simply and involves setting to zero the binary sum of data and code bytes. The second is less simply described and involves letting the data and code bytes be representative of elements of a finite field, namely, a Galois field, in order that those bytes may be algebraically manipulated within the field according to particular algebraic relationships.

Consider that N-2 data bytes, denoted $B_0$, $B_1$, ... $B_{N-4}$, $B_{N-3}$, are to be encoded with two code bytes, denoted $B_{N-2}$ and $B_{N-1}$, to form a data block of N bytes encoded according to Code C. In the embodiment herein disclosed, N equals 28. Also, in the embodiment herein disclosed, the byte parity selected is odd parity. Accordingly data bytes $B_0$ to $B_{N-3}$ each contain 7 data bits plus one added redundant bit for setting the parity of the byte to odd parity. For example, denoting the first seven data bits of $B_0$, $b_{0,1}$, $b_{0,2}$, ... $b_{0,7}$, the bit $b_{0,8}$ is selected as the parity bit for byte $B_0$, the value of which is determined so as to set the parity of byte $B_0$ to odd parity. The parity of each code byte is also set to the selected parity, viz. odd parity.

A description of each of the aforementioned two conditions, which define, according to Code C, the two code bytes, $B_{N-2}$ and $B_{N-1}$, follows.

(i) The first condition, of two, which defines the bytes of a Code C codeword

By the first condition defining a Code C codeword, the binary sum (i.e. modulo 2 arithmetic) of all bytes in the data block is set to zero (i.e. 00000000). This may be expressed mathematically by the following:

$$\sum_{i=0}^{N-1} B_i = B_0 + B_1 + \ldots + B_{N-2} + B_{N-1} = 0 \quad (1)$$

It will be noted that the above sum sets the vertical bit parity of the bytes to even parity since the sum of each set of vertically grouped bits is set to zero. The terms "vertical parity" and "vertically grouped bits" referring to the bit groups $b_{0,1} + \ldots + b_{N-1,1}$; $b_{0,2} + \ldots + b_{N-1,2}$, etc.) To appreciate the reason for referring to "vertical" bits, visualize, for example, bytes $b_0$, ..., $b_{N-1}$, stacked one under another to form an array of bits of array size N rows × 8 columns. The sum defined by (1) above, requires that the parity of each column of bits is even, since the sum of all bits in a column is equal to zero. That is, the number of 1's in a column is required to be an even number. In fact, the parity selected for the embodiment herein disclosed is odd parity; therefore, the sum defined by (1) above, is really determined to equal 11111111. That is, if each column of bits, $b_{0,1}$, ... $b_{N-1,1}$; $b_{0,2}$, ..., $b_{N-1,2}$; etc., contains an odd number of 1's, then the sum of bits in each column equals 1.

The parity bits of data bytes $B_0$, ..., $B_{N-1}$, i.e. $b_{0,8}$, ... $b_{N-1,8}$, are excluded from the definition of the conditions which define the code bytes $B_{N-2}$ and $B_{N-1}$ if the code bytes are desired to be parity encoded. The reason for the exclusion of the parity bits of data bytes, is that the seven data bits are let to represent a Galois field element of $GF(2^7)$ and the code bytes, derived from the data bits, also represent an element of the Galois field. Thus, the code bits so derived comprise seven bits which leaves one bit for a parity check bit to form parity encoded code bytes. If eight bit Galois field elements are selected, the data bytes and code bytes, being representative of elements in the Galois field, each comprise eight bits and, therefore, the eight derived code bits cannot be easily parity encoded, the eighth bit already being used. This will become apparent from the discussion below pertaining to the relationship of Galois fields and the method of determination of the code bytes $B_{N-2}$ and $B_{N-1}$, in accordance with the present invention.

(ii) The second condition, of two, which defines the bytes of a Code C codeword

The second condition defining the Code C codeword, operates within a cyclic field of finite elements, selected herein as a Galois field of 128 elements. The condition is algeabraically defined under the finite field and each element of the selected field may be represented by seven bits which, in turn, can be parity encoded to form a byte by adding one parity check bit. Accordingly, by letting the data bits of data bytes represent field elements, multiplication and addition of the 7 data bits of data bytes can be performed within the field while the results of those operations remain within the field which means that they too can be represented by 7 bits. Therefore, arithmetic may effectively be performed, according to known rules of finite field arithmetic, on the data bits since the data bits represent field elements.

Galois field theory is well-known in the art of mathematics and, more specifically, in the art of information and coding theory. The textbook "An Introduction to Error Correcting Codes" by Shu Lin, published by Prentice-Hall, might be referred to for a relatively easy-to-understand description of Galois fields. For a more advanced discussion, the textbook "Information Theory & Reliable Communication", by R. G. Gallagher, published by McGraw-Hill, might also be referred to. Also, patent application Ser. No. 596,397, for an invention of the present inventor, describes in considerable detail many aspects of Galois field theory which are relevant to this invention. In view of the fact of the textbooks identified above, and many others which are publicly available, a detailed description of Galois field theory is not included herein. A summary description thereof, follows.

Galois Fields

The Galois field $GF(2^7)$ of 128 elements, including zero, is selected for the embodiment of the present invention disclosed herein. This field is selected because data bytes comprising seven data bits and one parity check bit are desired to be encoded and, it is desired that the codeword also comprise parity encoded bytes. Accordingly, it is appropriate to select a Galois field comprising elements which are capable of being represented by 7 bits in order that two 7 bit codes may be derived from the data bits and each code can then be encoded with a parity bit to form parity encoded code bytes.

However, the disadvantage of choosing 7 bit field elements (i.e. of $GF(2^7)$) is that only the data bits of data bytes are encoded for error detection and correction, the parity bit being excluded from the calculation of the code bytes. As an alternative, if this is unacceptable, a Galois field of 256 elements, (i.e. $GF(2^8)$) might be selected. Elements of $GF(2^8)$ may be represented by eight bits and, accordingly, each data byte, including the parity bit, could then represent a field element. Again, though, there is a disadvantage associated with using the field $GF(2^8)$ instead of the field $GF(2^7)$; if the field $GF(2^8)$ is selected, the code bytes can not be conveniently encoded for parity and, therefore, not all bytes of the encoded data block are conveniently encoded for parity. This means that an odd number of bit errors occurring in the code bytes cannot be detected through parity checking.

To illustrate the above, the form of the Galois field $GF(2^7)$ will now be discussed briefly. The primitive polynomial $X^7+X^3+1$, of degree seven, is selected and $\alpha$ is defined as a root of this polynomial. Therefore, $\alpha^7+\alpha^3+1=0$ and, if we select coefficients in $GF(2)$ comprising the elements 0 and 1, then modulo 2 arithmetic applies and $\alpha^7=\alpha^3+1$. The non-zero elements of $GF(2^7)$ are $\alpha^0, \alpha^1, \alpha^2, \ldots \alpha^{126}$. The field is cyclic and, therefore, $\alpha^{127}=1$. It is known that the first seven powers of (i.e. $\alpha^0, \alpha^1, \alpha^2, \alpha^3, \alpha^4, \alpha^5, \alpha^6$), called the basis elements, are linearly independent over $GF(2)$ and that every element of $GF(2^7)$ may be written as a sum of the basis elements. For example, the element $\alpha^2$ may be written as $0.\alpha^0+0.\alpha^1+1.\alpha^2+0.\alpha^3+0.\alpha^4+0.\alpha^5+0.\alpha^6$ which in turn can be represented simply by the coefficients of the polynomial as 0010000 (i.e. in the form of a 7 bit number). To generate $\alpha^8$ in 7 bit form, recall that $\alpha^8=\alpha(\alpha^7)=(\alpha^3+1)=\alpha^4+\alpha$. Therefore, $\alpha^8$ equals $0.\alpha^0+1.\alpha^1+0.\alpha^2+0.\alpha^3+1.\alpha^4+0.\alpha^5+0.\alpha^6$ which can be represented by the coefficients of the polynomial as 0100100. The 7 bit representation of elements of higher orders of $\alpha$ can be generated in a similar manner.

The elements of $GF(2^8)$ can be defined with respect to the primitive polynomial $1+X^2+X^3+X^4+X^8$ of degree eight, and the 8 bit representation of the elements can be formulated in a manner similar to the above. For greater detail, reference may be made to the aforementioned textbooks.

The arithmetic operations addition (which is the same as subtraction under modulo 2 arithmetic since $1+1=0$, i.e. $1=-1$) and, multiplication and division are defined under a Galois field (e.g. $GF(2^7)$ and $GF(2^8)$) comprising a finite number of elements. That is, two elements of a Galois field, when added, multiplied or divided, will result in an element of that Galois field. Addition is conveniently performed in using the bit representation of field elements, while multiplication and division are conveniently performed using the exponential form of representation of field elements. For example, consider elements $\alpha^2=0010000$ and $\alpha^8=0100100$ of $GF(2^7)$. To add these numbers, it is easiest to add, using modulo 2 arithmetic, the two elements as follows:

```
  0010000
  0100100
  -------
  0110100
```

The 7 bit number 0110100 represents the element $\alpha^{16}$ (which can be verified easily using Galois field theory and/or the above illustration for finding the representation of $\alpha^8$). Thus, $\alpha^2+\alpha^8=\alpha^{16}$.

To multiply or divide the two elements, it is easiest to use the exponential form of the elements as follows: $\alpha^2 \cdot \alpha^8 = \alpha^{2+8} = \alpha^{10}$ and, $\alpha^2/\alpha^8 = \alpha^{2-8} = \alpha^{-6} = 1/\alpha^6 = \alpha^{127}/\alpha^6 = \alpha^{127-7} = \alpha^{121}$. Both $\alpha^{10}$ and $\alpha^{121}$ may be represented by 7 bits as described above. Note that, since $\alpha^{127}$ equals 1, $\alpha^{127+X}$ equals $\alpha^X$.

Since the data bits of the data bytes comprise 7 bits, the data bits of a data byte may be treated as a Galois field element of $GF(2^7)$ and therefore the data bits of bytes may be added and multiplied either together or with selected field elements, in accordance with the principles of Galois field arithmetic illustrated above. Similarly, if all bits (i.e. the data bits and the parity bit) of the data bytes are desired to be encoded, and the Galois field $GF(2^8)$ is selected, all bits (i.e. 8 bits) of each data byte may be treated as an element of $GF(2^8)$ and therefore the data bytes may be added and multiplied either together or with selected elements of $GF(2^8)$, in accordance with the principles of Galois field arithmetic illustrated above.

Note that if finite field arithmetic is not employed and data bits (or data bytes) are not let to represent elements of a finite field, arithmetic manipulation of the data bits (or data bytes) would not necessarily result in 7 bit (or 8 bit) numbers as desired. For example, the 7 bit real number 1111111, representing in binary notation the real (infinite field) number 127, when multiplied by the 7 bit real number 0100000, representing in binary notation the real number 2, equals the real number 254 (in decimal notation). More than 7 bits are required to represent the real number 254 using binary notation, the real number 254 being represented in binary notation by the eight bits 01111111 (going from least significant to most significant bit).

The second condition of Code C is defined by the following sum, where $B_0$ to $B_{N-1}$ are as defined above, $B_{N-2}$ and $B_{N-1}$ comprising the code bytes of the Code C codeword.

$$\sum_{i=0}^{N-1} B_i\alpha^i = B_0 + B_1\alpha^1 + \ldots + B_{N-1}\alpha^{N-1} = 0 \qquad (2)$$

Encoding: Selection of Code Bytes

From conditions (1) and (2) defined above, the bytes of the codeword, $B_{N-2}$ and $B_{N-1}$, may be defined. That is, we have two unknowns in two equations and therefore the unknowns can be solved for. The following solution was selected, for convenience, for use in the embodiment of the present invention herein disclosed: However, it should be recognized that given conditions (1) and (2) above, the value of the code bytes $B_{N-2}$ and $B_{N-1}$ is uniquely defined and all valid expressions derived from conditions (1) and (2) defining the code bytes, are equivalent. (That is, all such expressions result in identical code bytes.) Accordingly, several other derivations of relationships, defining the code bytes, apart from those provided below and used herein, might be selected for use in the present invention, the preferred relationship depending upon, inter alia, personal preference and the type of electronic devices selected to implement this invention.

Recall that if, for example, GF($2^7$) is selected, then $\alpha^{-1} = \alpha^{127} \cdot \alpha^{-1} = \alpha^{127-b\,1} = \alpha^{126}$. Of course, $\alpha^{126}$, being an element of GF($2^7$) has a unique 7 bit representation. For convenience, let $\gamma = \alpha^{-1}$. Then, by dividing both sides of equation (2) by $\alpha^{N-1}$ condition (2) above can be written as follows:

$$B_0\gamma^{N-1} + B_1\gamma^{N-2} + \ldots + B_{N-2}\gamma + B_{N-1} = 0 \qquad (3)$$

Thus from relationships (1) and (3) above, $$B_{N-2} + B_{n-1} = B_0 + B_1 + \ldots + B_{n-3} \text{ and,}$$

$$B_{N-2}\gamma + B_{N-1} = B_0\gamma N - 1 + B_1\gamma N - 2 + \ldots + B_{N-3}\gamma 2$$

If we let $$\sigma = B_0 + B_1 + \ldots + B_{N-3} \qquad (4)$$

and, $$\tau = B_0\gamma^{N-3} + B_1\gamma^{N-4} + \ldots + B_{N-3} \qquad (5)$$

Then, $$B_{N-2} + B_{N-1} = \tau \qquad (6)$$

and, $$B_{N-2}\delta + B_{N-1} = \tau\gamma^2 \qquad (7)$$

The code bytes $B_{N-2}$ and $B_{N-1}$ may be derived from the expressions (6) and (7) above, with the following results:

$$B_{N-2} = (\sigma + \tau\gamma^2)/(1 + \gamma) = (\sigma + \tau\gamma^2)\gamma 30, \qquad (8)$$

since $1/(1+\gamma) = \gamma^{30}$ $$B_{N-1} = \sigma + B_{N-2} \qquad (9)$$

It will be apparent to the reader that the values o and $\tau$ are determined from the data bytes $B_0$ to $B_{N-3}$ which are to be encoded. Therefore, the code bytes $B_{N-2}$ and $B_{N-1}$ (comprising code bits) are determined algebraically from the data bytes within GF($2^7$) (or GF($2^8$)) according to relationships (8) and (9) above.

If GF($2^7$) is selected, only the data bits of data bytes $B_0$ to $B_{N-3}$ are considered in the above relationships and, $\alpha$ equal to $\gamma^{-1}$ is an element of GF($2^7$) capable of representation by 7 bits. The code bytes $B_{N-2}$ and $B_{N-1}$ are therefore also elements of GF($2^7$) and each comprises 7 code bits plus one parity check bit. The parity check bit is the eighth bit of each code byte and is determined according to the selected parity. For example, if odd parity is selected and there are an odd number of 1's in the seven bit representation of the field element determined according to relationship (8) or (9) above, then the 8th bit is set to zero so that the code byte has odd parity. Conversely, if there is an even number of 1's, the 8th bit is set to 1 to produce an odd parity code byte.

If GF($2^8$) is selected, all of the bits i.e. data bits and parity bit, of data bytes $B_0$ to $B_{N-3}$ are considered in the above relationships, and $\alpha$ equal to $\gamma^{-1}$ is an element of GF($2^8$) capable of representation by 8 bits. The code bytes $B_{N-2}$ and $B_{N-1}$ are, therefore, also elements of GF($2^8$) and may be represented by 8 bits. Accordingly, there is not then an unused bit which can be conveniently used to set the parity of the code bytes, all 8 bits of the code byte being defined by conditions (1) and (2) above. Therefore, if all of the bits of data bytes $B_0$ to Bhd N-3 are encoded according to Code C, the code bytes are not conveniently parity encoded.

Decoding according to Code C

If bytes $B_0$ to $B_{N-1}$, comprising one data block, satisfy condition (1) and (2) defined above, a bit error pattern, denoted $e_j$, occurring in byte $B_j$, or bit error patterns, denoted $e_j$ and $e_k$, occurring in two bytes $B_j$ and $B_k$ providing that j and k are known (for $0 \leq j,k \leq N-1$), can be determined and the incorrect bytes can therefore be corrected.

The first case of application of Code C is where one byte, denoted $B_j$ is received with one or more bits in error. If we denote the error pattern of bits $e_j$, the summations of conditions (1) and (2) above occur as follows:

$$B_0 + \ldots + B_j + e_j + \ldots + B_{N-1} = 0 + e_j \qquad (10)$$

$$B_0 + \ldots + (B_j + e_j)\alpha^j + \ldots + B_{N-1}\alpha^{N-1} = 0 + e_j\alpha^j \qquad (11)$$

Therefore, if we write the received bytes $B_0$ to $B_{N-1}$ as $B_0$ to $B_{N-1}$, then:

$$R_1 = \sum_{i=0}^{N-1} B_i' = e_j \qquad (12)$$

and, $$R_2 = \sum_{i=0}^{N-1} B_i'\alpha^i = e_j\alpha^j \qquad (13)$$

From relationships (12) and (13) above, it is apparent that the incorrect byte $B_j$, having a bit error pattern $e_j$, may be identified by determining the value j, according to the following:

$$j = \log\alpha(R_2/R_1) = \log\alpha(e_j\alpha^j/e_j) = \log\alpha(\alpha j) \qquad (14)$$

Thus, if one byte of the data block is received in error, the incorrect byte (viz. the jth byte, denoted $B_j$) and the incorrect bits of that byte which are identified by the bit error pattern $e_j$, may be determined according to the above and thereafter corrected by adding the error pattern $e_j$ to the identified incorrect byte $B_j$. In the case where only one byte $B_j$ of a block is received with bit errors the incorrect byte $B_j$ can be identified (i.e. by the value j) and corrected (i.e. using the bit error pattern $e_j$) whether or not the byte has incorrect parity.

Since the value j is represented by a maximum of seven bits, in the case where the Galois Field $GF(2^7)$ is selected, or eight bits, in the case where the Galois Field $GF(2^8)$ is selected, the range of values possible for j is 0 to 127 or 0 to 255, respectively. Therefore a maximum of 128 or 256 bytes (or packets) may comprise one data block where the block is coded according to Code C, depending upon whether the Galois Field $GF(2^7)$ or $GF(2^8)$, respectively, is selected.

To correct byte $B_j$, the error pattern $e_j$ determined according to the above, is added to received byte $B_j'$. For example, consider that the second and third bits of byte $B_j$ are received in error. Then error pattern $e_j$ equals 0110000, if $GF(2^7)$ is selected, or 01100000, if $GF(2^8)$ is selected. By adding $e_j$ to the received byte $B_j'$ the incorrect bits will be changed and therefore corrected since modulo 2 addition is used.

The second case of application of Code C is where two bytes denoted $B_j$ and $B_k$ are received with one or more bits in error. If we denote the bit error patterns for those bytes, $e_j$ and $e_k$, respectively, the summations of conditions (1) and (2) above occur as follows:

$$B_0 + \ldots + B_j + e_j + \ldots + B_k + e_k + \ldots + B_{N-1} = 0 + e_j + e_k \quad (15)$$

$$B_0 + \ldots + (B_j + e_j)\alpha^j + \ldots + (B_k + e_k)\alpha^9 + \ldots + B_{N-1}\alpha^{N-1} = 0 + e_j\alpha^j + e_k\alpha^k \quad (16)$$

Therefore, if we write the received bytes $B_0$ to $B_{N-1}$ as $B_0'$ to $B_{N-1}'$ then:

$$R_1 = \sum_{i=0}^{N-1} B_i' = e_j + e_k \quad (15a)$$

and $$R_2 = \sum_{i=0}^{N-1} B_i'\alpha^i = e_j\alpha^j + e_k\alpha^k \quad (16a)$$

If j and k are known (i.e. if the incorrect bytes are identifiable, for example, by showing parity failure) expressions (15a) and (16a) above enable the solution of the bit error patterns $e_j$ and $e_k$ since two unknowns occurring in two independent expressions can be determined through solution of the expressions.

Again, as stated above, with respect to encoding, various expressions of the solution of $e_j$ and $e_k$ might be selected. The following derivations and resulting relationships have been selected herein for convenience only and the present invention is not intended to be limited to embodiments which utilize these expressions. It will be recognized that there are an unlimited number of ways to equivalently express any particular algebraic relationship and that it is the conditions defining the derived relationships which are unique. Here it is the conditions defined by (1) and (2) above which are unique.

Assume that code bytes $B_{N-2}$ and $B_{N-1}$ have been determined according to relationships (8) and (9) above and that data bytes $B_j$ and $B_k$ are received with the error patterns $e_j$ and $e_k$, respectively. Then:

$$\sigma' = B_0 + \ldots + B_j + e_j + \ldots + B_k + e_k + \ldots + B_{N-1} = 0 + e_j + e_k \quad (17)$$

and, $$\tau' + B_0\gamma^{N-1} + \ldots + (B_j + e_j)\gamma^{N-1-j} + \ldots + (B_k + e_k)$$
$$\gamma^{N-1-k} + \ldots + B_{N-1} = 0 + e_j\gamma^{N-1-j} + e_k\gamma^{N-1-k} \quad (18)$$

Thus assuming that two incorrect data bytes, denoted $B_j$ and $B_k$, are received in error.

$$\tau' = e_j + e_k \quad (19)$$

$$\tau' = e_j\gamma^{N-1-j} + e_k\gamma^{N-1-k} \quad (20)$$

where, $\tau'$ and $\tau'$ are defined by (17) and (18) above.

If the values j and k are known, the bit error patterns $e_j$ and $e_k$ are added to the received incorrect bytes $B_j$ and $B_k$, respectively, to correct the bytes. From relationships (19) and (20) above, the bit error patterns $e_j$ and $e_k$ may be determined from the following:

$$e_j = (*\sigma'\gamma^{N-1-k} + \tau')/(\gamma^{N-1-j} + \gamma^{N-1-k}) \quad (21)$$

$$e_k = \sigma' + e_j \quad (22)$$

Note that, if the Galois field $GF(2^7)$ is selected, error patterns $e_j$ and $e_k$ comprise 7 bits only and permit the correction of data bits of bytes $B_j$ and $B_k$ only. If the Galois field $GF(2^8)$ is selected, the bit error patterns $e_j$ and $e_k$ comprise 8 bits each and permit the correction of all bits, (i.e. data bits and parity bit) of bytes $B_j$ and $B_k$.

The above completes the description of the method of coding a block of data bytes according to Code C. A bundle arrangement of data blocks, encoded according to the above, may be selected in accordance with the present invention, and each vertical data block encoded with a Code C codeword to permit the correction of a greater number of bytes than is permitted by data block coding alone. The following is a description of the bundle coding method used in the present invention.

Bundle Coding Using Code C:

Bundle coding refers herein to a coding process whereby data blocks are encoded according to the above and thereafter arranged in a bundle for vertical encoding. A bundle comprises a number of encoded data blocks "stacked" (conceptually) one under another, the bytes of each block aligned to form an array of bytes. The encoded data blocks, denoted herein as horizontal data blocks, form rows of the array. To encode the bundle, the columns of the bundle array of bytes are encoded with two Code C code bytes according to the above described method, forming encoded vertical data blocks. Thus, bundle coding involves an array of data bytes, each row encoded horizontally with a Code C codeword, and each column (or group of two columns), encoded vertically with a Code C codeword.

As stated above, the selected size of data blocks for the description herein is 26 data bytes and two code bytes. The number of data blocks in one bundle is denoted herein as h data blocks.

FIG. 1 of the drawings shows one arrangement for the data blocks of a bundle. The bundle comprises an array of bytes as illustrated. The coding format of FIG. 1, for coding columns of the bundle, includes one code block, denoted block h.

To encode a bundle of encoded data blocks, using one block of codewords, two columns of bytes of the bundle of data blocks are encoded together forming one vertical data block. Each byte of the two byte Code C codeword for a vertical data block is positioned in an appended code block (i.e. block h), one code byte positioned below each of the two columns of the vertical data block. It is preferable to stagger, to the extent possible, the two columns of each vertical data block because noise bursts are likely to cause errors in consecutive bytes of a (horizontal) data block during transmission each (horizontal) data block of the bundle being transmitted one after the other. By encoding staggered columns, non-consecutive bytes of each data block are encoded together and this increases the probability that fewer bytes containing errors will occur in each vertical data block and, as a result, the probability that more than two incorrect bytes will be received in a vertical data block decreases. In turn, the probability of error detection and correction increases.

In the present embodiment, bundle columns are staggered by one half the number of data bytes per data block i.e. by 13 columns. Therefore, the first vertical data block comprises the first byte of each data block in the bundle and the fourteenth byte of each data block in the bundle. The second vertical data block comprises the second and fifteenth bytes of each data block in the bundle, and so on, to the last vertical data block which comprises the thirteenth and twenty-sixth bytes of each data block in the bundle.

The data bytes of each vertical data block are encoded according to Code C, described above, with two code bytes for each vertical data block. One code byte is appended to each column of the vertical data block. Each vertical data block is encoded in like manner and, therefore, one code byte is produced for each column of data bytes of the bundle for a total of N-2 code bytes, where N is the number of bytes in an encoded data block (i.e. herein selected as 28). The vertical code bytes comprise a code block, being block h in FIG. 1. The last two bytes of the code block may comprise a Code C codeword for either the code block or the vertical block comprising the last two columns of the bundle. Preferably the last two bytes of the code block are Code C code bytes for the code block. By this choice both data and code blocks are encoded in like manner and each can be decoded, according to the above, in like manner as the block is received. When the bundle of data blocks has been received the vertical data blocks are decoded to complete the decoding of the bundle.

Figure 2:
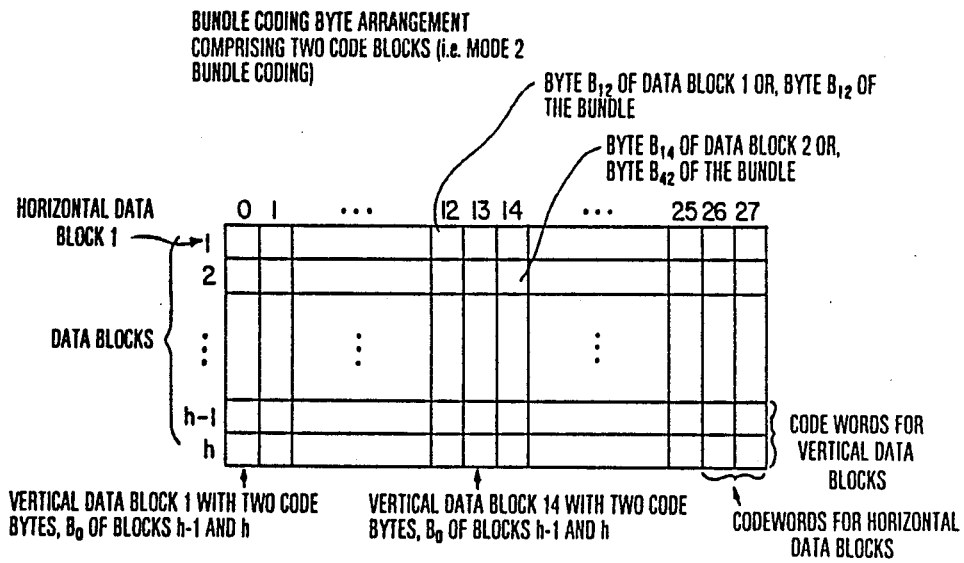
FIG. 2 illustrates, by way of pictorial representation, the arrangement of data bytes and code bytes forming an encoded data block bundle, the bundle comprising encoded data blocks and two code blocks.

FIG. 2 illustrates a bundle coding format which utilizes two code blocks, denoted blocks h-1 and h. If two code blocks are used to encode a bundle of data blocks it is not necessary to include more than one column of the bundle array in each vertical data block because the two code bytes for the vertical data block can each be positioned in separate code blocks viz. blocks h-1 and h. For example, the first column of the bundle may comprise the first vertical data block, the bytes of the codeword for the block being the first bytes of code blocks h-1 and h. Each column is encoded in a similar manner so that the code bytes for that column are positioned in code blocks h-1 and h, the column position of each corresponding to the column of encoded data bytes. Again, the last two bytes of each code block may be used for encoding either the associated vertical or horizontal block, the latter being preferable.

Decoding Data Block Bundles

To decode bundles of data blocks, encoded according to the above, comprising encoded vertical and horizontal data blocks, bit error patterns for one or two incorrect data bytes of each encoded data block are produced and used to correct the incorrect bytes. Decoding of vertical and horizontal data blocks is performed according to the above description under the heading "Decoding According to Code C.".

All data blocks of the bundle (i.e. horizontal data blocks), are decoded as they are received, according to the above, to detect and correct all one or two byte errors which are correctable by Code C. Then, each vertical data block is identified and decoded in like manner until all vertical data blocks have been decoded. That is, until all correctable one or two byte errors occurring in each vertical data block have been corrected. The reader will recognize that horizontal data byte corrections themselves may enable further byte corrections upon decoding vertical data blocks. To illustrate this, suppose that, in FIG. 1, bytes $B_0$ and $B_1$ of data block 1, bytes $B_0$, $B_1$ and $B_2$ of data block 2, and bytes $B_0$, $B_1$, and $B_4$ of data block 3 are received in error. The incorrect bytes $B_0$ and $B_1$ of data block 1, are corrected upon decoding data block 1 (assuming that the bytes show parity failure). However, the incorrect bytes of the second and third data blocks cannot, as yet, be corrected because more than two incorrect bytes have occurred in those data blocks. Following the decoding of (horizontal) data blocks the first vertical data block contains only two incorrect bytes because of the correction made upon decoding horizontal data block 1. Thus the incorrect bytes of the first vertical data block can now be corrected upon decoding the block (again assuming that the incorrect bytes show parity failure). Thus, the correction of byte $B_0$ of horizontal data block 1, performed upon decoding horizontal data block 1, enables byte corrections to be made upon decoding vertical data block 1. This is because horizontal decoding may reduce the number of incorrect bytes occurring in vertical data blocks. Similarly, if vertical data block decoding results in some byte corrections, those corrections may enable further corrections to be made upon a second cycle of horizontal data block decoding. To illustrate this, consider the above example again. Decoding vertical data block 1 results in the correction of bytes $B_0$ of horizontal data blocks 2 and 3. Thereafter, horizontal data blocks 2 and 3 each contain only two bytes in error and each of those two incorrect bytes can be corrected by decoding (horizontal) data blocks 2 and 3 once again.

This process of horizontal and vertical decoding, can be repeated as often as desired, to correct a number of incorrect bytes remaining in the bundle. If a byte correction is not made during the current decoding cycle, (i.e. horizontal or vertical decoding), there is no point in going through another decoding cycle because no more errors will be correctable than were in the last such cycle. The optimal number of decoding cycles selected depends upon the probable error pattern of the bundle data bytes which in turn is dependent upon a number of factors such as the selection of transmission channel, modulation method, etc. Accordingly, it may be desirable to adapt the apparatus and method described herein to perform repetitive horizontal and vertical decoding cycles satisfactorily within selected operating parameters.

By way of example, apparatuses for encoding and decoding data blocks and bundles of data blocks, according to the above, will now be described. However, the examples provided are for the purpose of illustration only and the scope of the present invention is not limited to the disclosed embodiments of the invention. As is well-known in the electronic communications industry, most logic (including arithmetic logic) designs which perform a particular task can be implemented in a variety of ways; for example, by using a microprocessor-based circuit design controlled by a selectable set of instructions recorded in Read Only Memory (ROM). Due to the relative simplicity of a microprocessor design and the smaller number of discrete circuit devices required for the same, as compared with functionally equivalent discrete logic device designs, it is normally preferable to implement complex logic designs using a microprocessor. However, if for some reason it is desired to implement the present invention using a functionally equivalent combination of discrete logic devices, or medium-scale or large-scale integration devices, it is a relatively simple procedure to do so, for one skilled in the art, given the present disclosure of the invention and, in particular, the following descriptions of apparatuses.

In the present system, a microprocessor-based means to encode and decode a data block and a bundle of data blocks, is selected. Numerous specific circuit designs might be appropriate for any particular application of the present invention, depending upon desired speed, cost, etc. A specific circuit design is not described herein; one skilled in the art can readily design appropriate circuitry, as desired, to implement the present invention given the following description and the flowcharts of FIGS. 3 to 8. As will be noted by the reader, these flowcharts include many descriptive notes concerning the steps of the processes illustrated by the flowcharts. A detailed description of the flowcharts is not repeated in the following text; reference should be made to FIGS. 3 to 8 for explanatory comments, the figures being substantially self-explanatory.

It is well known by persons skilled in the art that microprocessors are able to perform a variety of data processing and arithmetic operations on digital data without a requirement for several distinct single purpose devices such as adding or multiplying devices, or storing, retrieving, comparing or assembling devices. This is because a microprocessor provides, in combination, many distinct electronic devices all integrated into one semiconductor component.

A microprocessor generally includes inter alia at least one parallel data input (e.g. eight input lines for receiving input data in byte form), one parallel data output, one or more serial input/output lines, memory address lines, working registers and a central processing unit including an arithmetic logic unit. Data may be received by the microprocessor, manipulated in a predetermined manner according to a memory-stored instruction set controlling the microprocessor, and then stored in memory in a predetermined format or arrangement. Fixed data such as logarithm or exponential table values may also be stored in memory (e.g. ROM or PROM if such data is not to be changed or RAM if it is) to be accessed by the microprocessor as required. Well known methods and apparatus are available in the marketplace for "programming" a programmable read only memory (PROM) chip with fixed data as desired.

By using a microprocessor (with associated memory) a large number of data manipulations may be performed as desired according to an instruction set (i.e. a program) which is stored in memory (e.g. ROM), each instruction being read in sequence by the microprocessor. Given a flowchart outlining the operations to be performed by the instruction set a skilled programmer may readily translate the steps of the flowchart into the particular instruction language utilized by the particular selected microprocessor. Likewise, given an appropriately written instruction set, and memory containing the same, a skilled electronic technician, familiar with microprocessor designs may readily wire a selected microprocessor (and peripheral components) appropriately to communicate with and process received data packets (bytes) according to the instruction set. The specifics of any such programming or wiring steps are outside the scope of this invention and would require an unmanageably lengthy description to include in this description. Numerous books, journals and the like on these subjects are readily available in the marketplace.

Apparatus to Encode a Data Block

As indicated above, a microprocessor-based design is best selected to encode a data block according to the above description of encoding data blocks using Code C. The data bits of data bytes are encoded and, therefore, the Galois field $GF(2^7)$ is selected for use as described above. In general terms, the following description is equally applicable to the case where all bits (i.e. data and parity bits) are encoded and the Galois field $GF(2^8)$ is selected. Some modification of the following description is necessary for the latter case; however, the modifications necessary can be readily effected by someone having even a minimum level of skill in the art of writing instruction programs to implement a particular task or process.

Figure 3A:
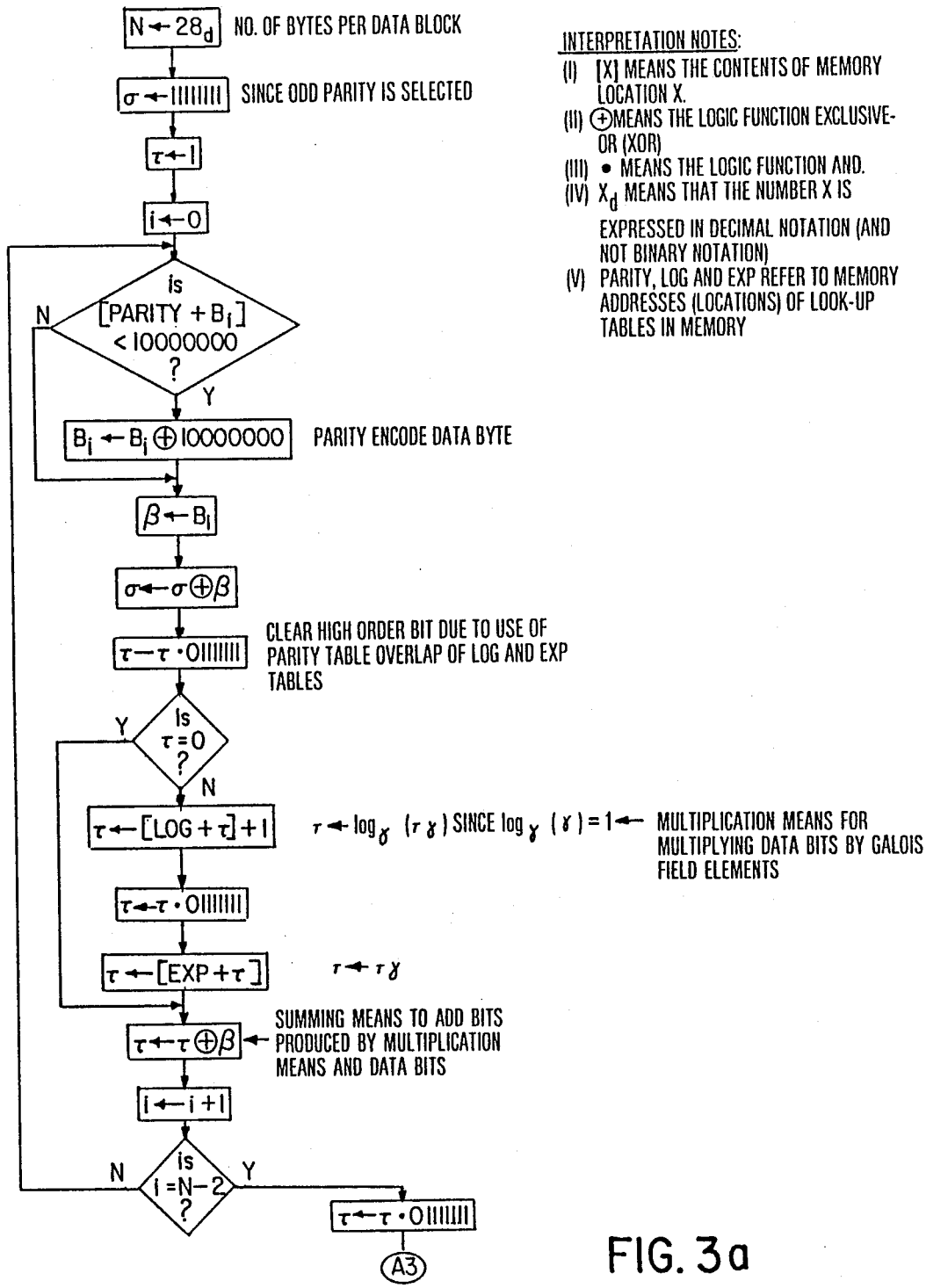
FIGS. 3a and 3b (referred to collectively herein as "FIG. 3") illustrates, in flowchart form, a process for encoding a number of data bytes with two code bytes according to Code C, to form an encoded data block.
Figure 3B:
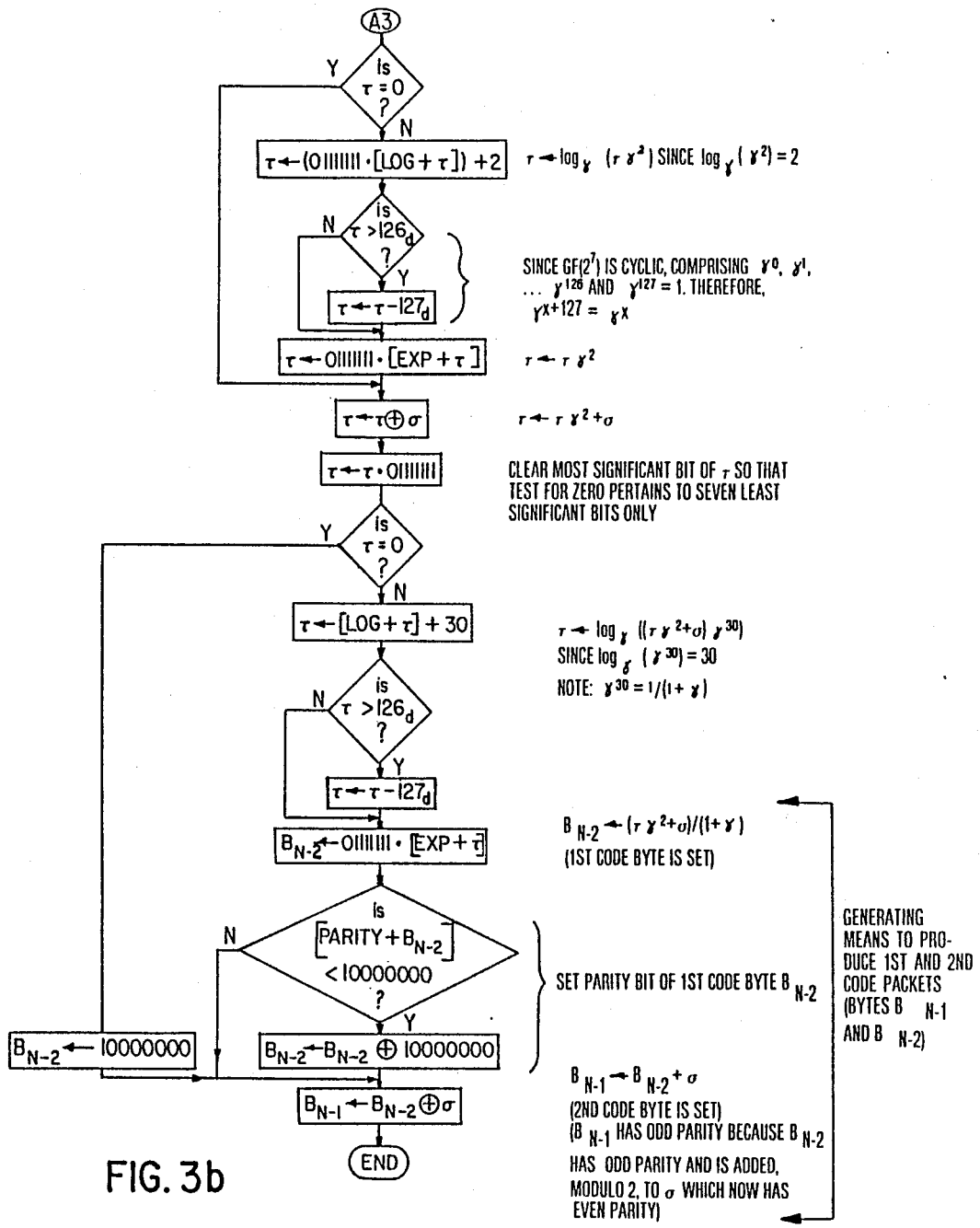

FIG. 3 shows, in flowchart form, the steps (i.e. operations) to be performed by a microprocessor in accordance with a preferred embodiment of the invention to encode a data block. As described above, the data bytes $B_0$ to $B_{25}$ are received by the encoder, identified as a group of data bytes to be encoded, encoded according to the relationship (8) and (9) above to generate code bytes $B_{26}$ and $B_{27}$ (in this example of 28 bytes per data block) and then assembled to produce an encoded data block. Look-up tables are used to test the parity check bits of the data bytes which, if incorrect, is set correctly and to accomplish multiplication (via logarithm, exponential and summing operations) because this method of doing these operations requires less time (i.e. fewer microprocessor cycles) and is simple to do when using a microprocessor to encode the data. Thus, the combination of a microprocessor and memory-stored look-up tables provides a number of the required processing means—for example, parity testing means, multiplication means and summing means. It also provides the means to identify the data bytes $B_0$ to $B_{25}$, to generate the code bytes $B_{26}$ and $B_{27}$ and to assemble the data bytes and code bytes into one data block. The disadvantage of this method of accomplishing these operations is that additional memory is required to hold the results (i.e. the parity encoded byte and product, respectively) of the look-up tables. The effect of this disadvantage may be reduced by overlapping the look-up tables. Specifically, the parity check-bit table (PARITY) overlaps the logarithm (LOG) and exponential (EXP) tables. This is possible because only the most significant bits of the bytes of the parity table are required and the seven least significant bits of the bytes of the logarithm and exponential tables. Furthermore, the parity table contains $2^8$ (i.e. 256) elements and the logarithm and exponential tables each contain $2^7$ (i.e. 127) elements and, therefore, the parity table exactly fits over the exponential and logarithm tables. Thus, only 256 memory bytes are required to store all three tables.

The tables are arranged in memory so that the position offset, from the top of the table to a particular element in the table, corresponds to the information contained in that memory element. To illustrate this, consider one element of each table, for example, the tenth element of the tables PARITY, LOG and EXP.

If, for example, table PARITY starts at memory location 1024, then the most significant bit of memory location $1024+10$ (i.e. memory location 1034) is set according to the parity of the offset byte, so that the parity of the offset byte can be determined immediately by checking the bit of memory location PARITY+10. This saves having to add together each bit of the offset byte to determine the parity of the byte (which would entail several steps and, therefore, consume a significant amount of processing time). The byte $B_i$ equal to 00001010, having the decimal value 10, when added to the value PARITY (PARITY being the value 1024 equal to the address of the first memory location of the table PARITY), addresses the tenth element of the PARITY table and that element has been set (for example by programming a PROM) to contain a 1 in the most significant bit. The bit is a 1 because the offset byte of the address of the table element, i.e. 00001010, has even parity. However, since odd parity has been selected, the bit is set to 1 to indicate that the parity of the offset byte is even and must be set to odd parity. Therefore, by adding the byte $B_i$, whose parity is to be tested, to the value PARITY (the first memory address of this table), and checking the most significant bit of the memory location PARITY+$B_i$, the parity of the offset ("lookup") byte $B_i$, is determined.

The form of tables LOG and EXP is similar to the form of table PARITY, but in the case of each of these two tables it is the 7 least significant bits of the table elements which are of interest and not the most significant bit. Table LOG is given the same starting location as table PARITY and table EXP starts immediately at the end of table LOG (i.e. corresponding to the location of the 129th element of table PARITY). The 10th element of table LOG, is addressed by the value of the first 7 bits (i.e. the data bits) of the byte $B_i$ plus the value LOG (i.e. 1024 in the above example). This element contains, in the first 7 bits, the value $\log_\gamma$ (0001010). Therefore, by simply addressing the memory location the value of the logarithm of the data bits used to address the location is obtained.

It should be noted that it is necessary to clear the most significant bit of the byte $B_i$ before addressing the tables LOG and EXP because the offset value can be a value from 0 to 127 only if the Galois field GF($2^7$) is selected. This is because the offset value represents a Galois field element from 0 to 127. Similarly, when the tables LOG and EXP are addressed the most significant bit of the addressed memory locations should be cleared because, due to the overlap of the PARITY and LOG and EXP tables, the most significant bit of those locations is a parity check bit and does not form a part of the logarithm or exponential value. Under the Galois field GF($2^7$), $\log_\gamma(x)$ and $\gamma^x$ are 7 bits only (which enables one to use the 8th bit for parity testing by means of the table PARITY.)

Table EXP is given a starting address 128 bytes higher than the first memory location address of the table PARTIY (and EXP), namely $1024+128=1152$ in the above example. The contents of memory location $B_i$+EXP, being memory location $1052+10$ in the example, contains the value $\gamma^{10}$ in the seven least significant bits of the element. Therefore, by addressing memory location $B_i$+EXP, the value $\gamma B_i$ is obtained. (Note that here the value "$B_i$" is intended to refer to the data bits of byte $B_i$ only.)

From FIG. 3, it will be appreciated that multiplication (of 7 bit values) is performed by adding the logarithms of numbers together and then looking up the exponential value of the sum. To repeat, this method is selected to reduce the time required to determine the code bytes $B_{N-2}$ and $B_{N-1}$; it is not essential to the present invention.

The value determined by the processing means is determined according to relationship (5) above, using Horner's method of evaluating a polynomial. That is, $$\tau = B_0\gamma^{N-3} + B_1\gamma^{N-4} + \ldots + B_{N-3}$$
$$= (\ldots((B_0\gamma + B_1)\gamma + B_2)\gamma \ldots)\gamma + B_{N-3}$$

Apparatus to Decode a Data Block

FIG. 4 shows, in flowchart form, the steps (i.e. operations) performed by a microprocessor in accordance with a preferred embodiment of the invention to decode a data block encoded according to the above. The lookup tables described above with respect to the encoder, are also used in the decoder. A description of the same is not repeated under this heading. The above comments pertaining to tables PARITY, EXP and LOG are equally applicable with respect to the decoder.

Figure 4A:
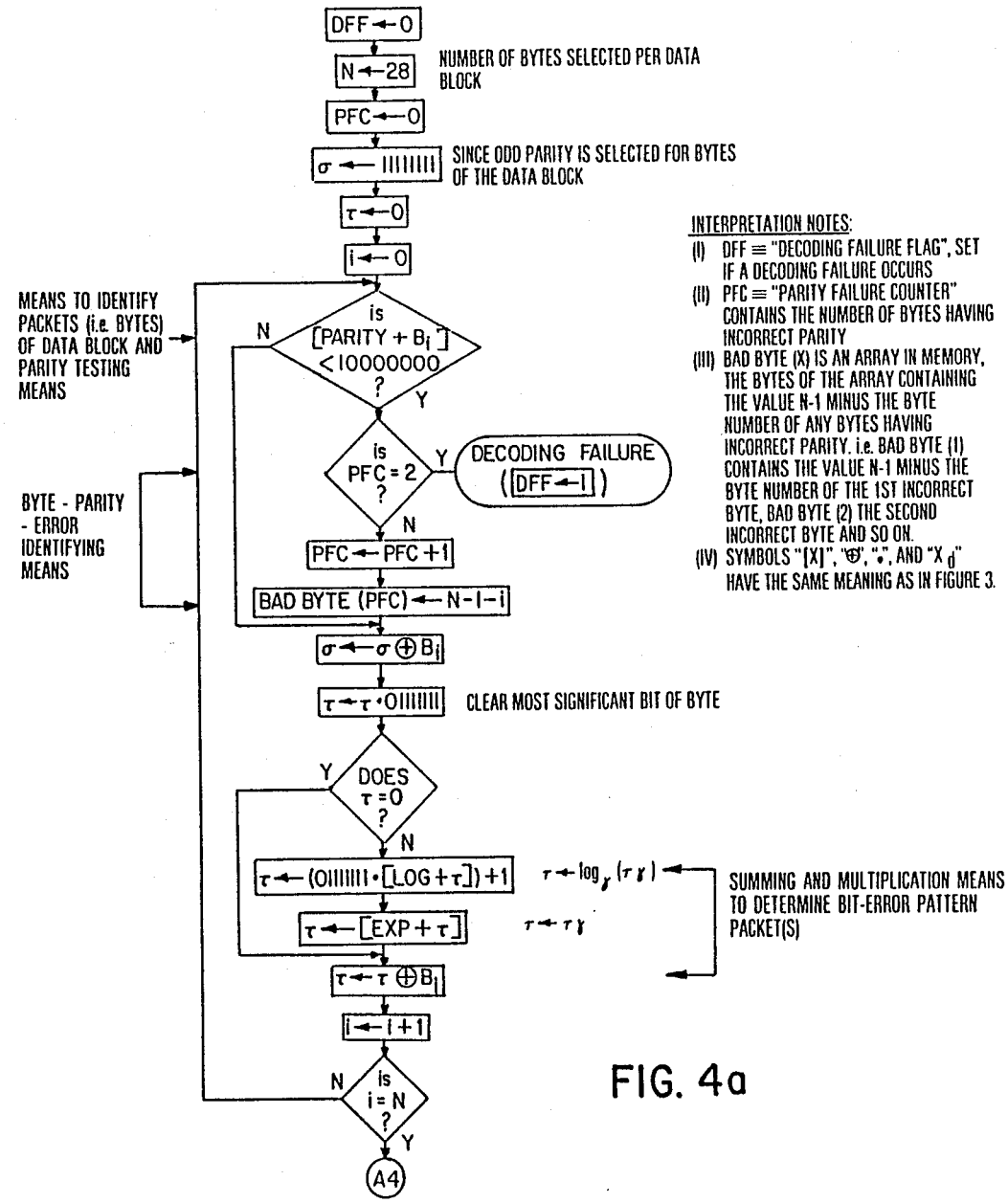
FIGS. 4a, 4b, 4c, 4d and 4e (referred to collectively herein as "FIG. 4") illustrates, in flowchart form, a process for decoding an encoded data block having two Code C code bytes, and correcting one or two incorrect bytes of the block, as permitted.
Figure 4B:
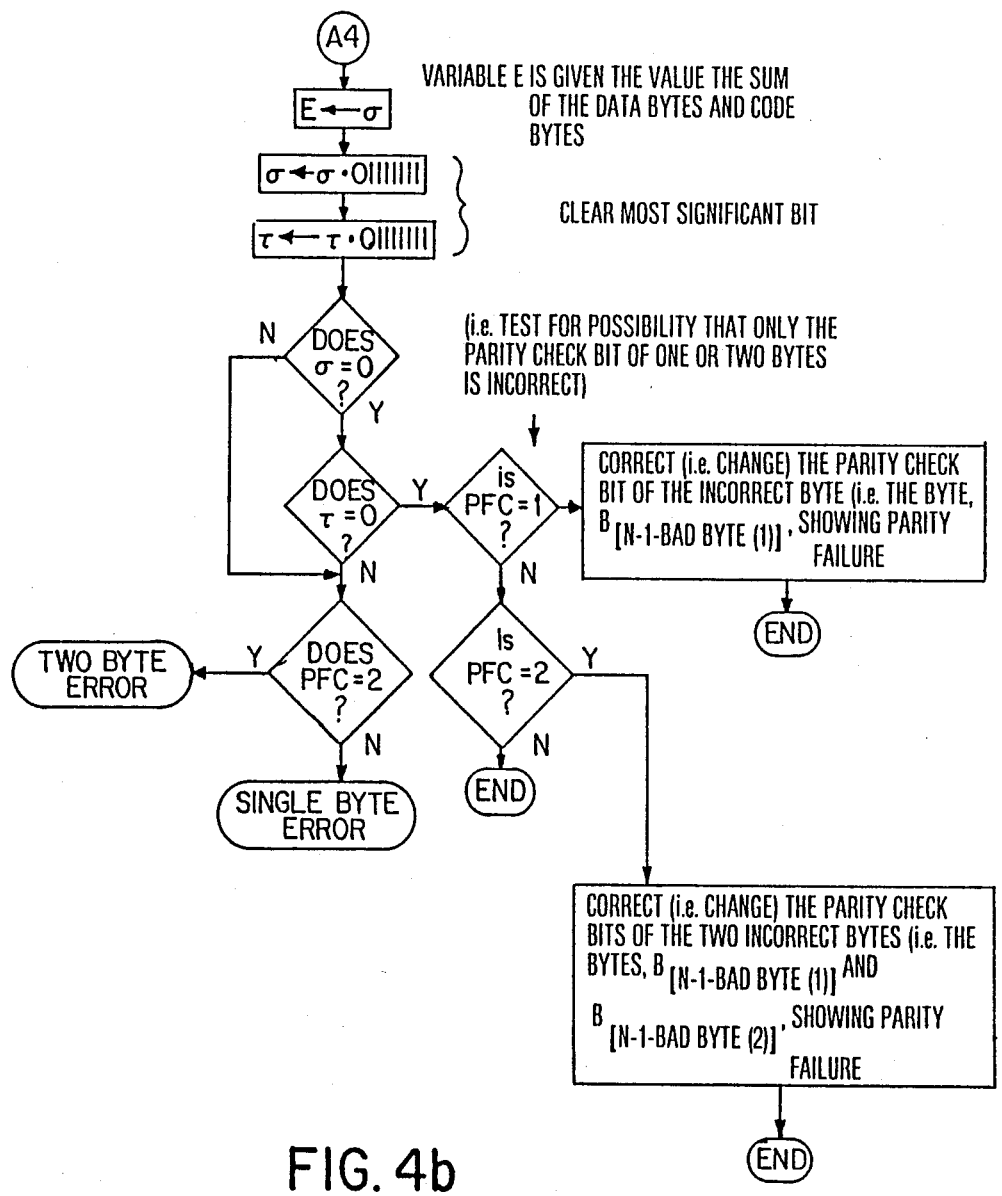
Figure 4C:
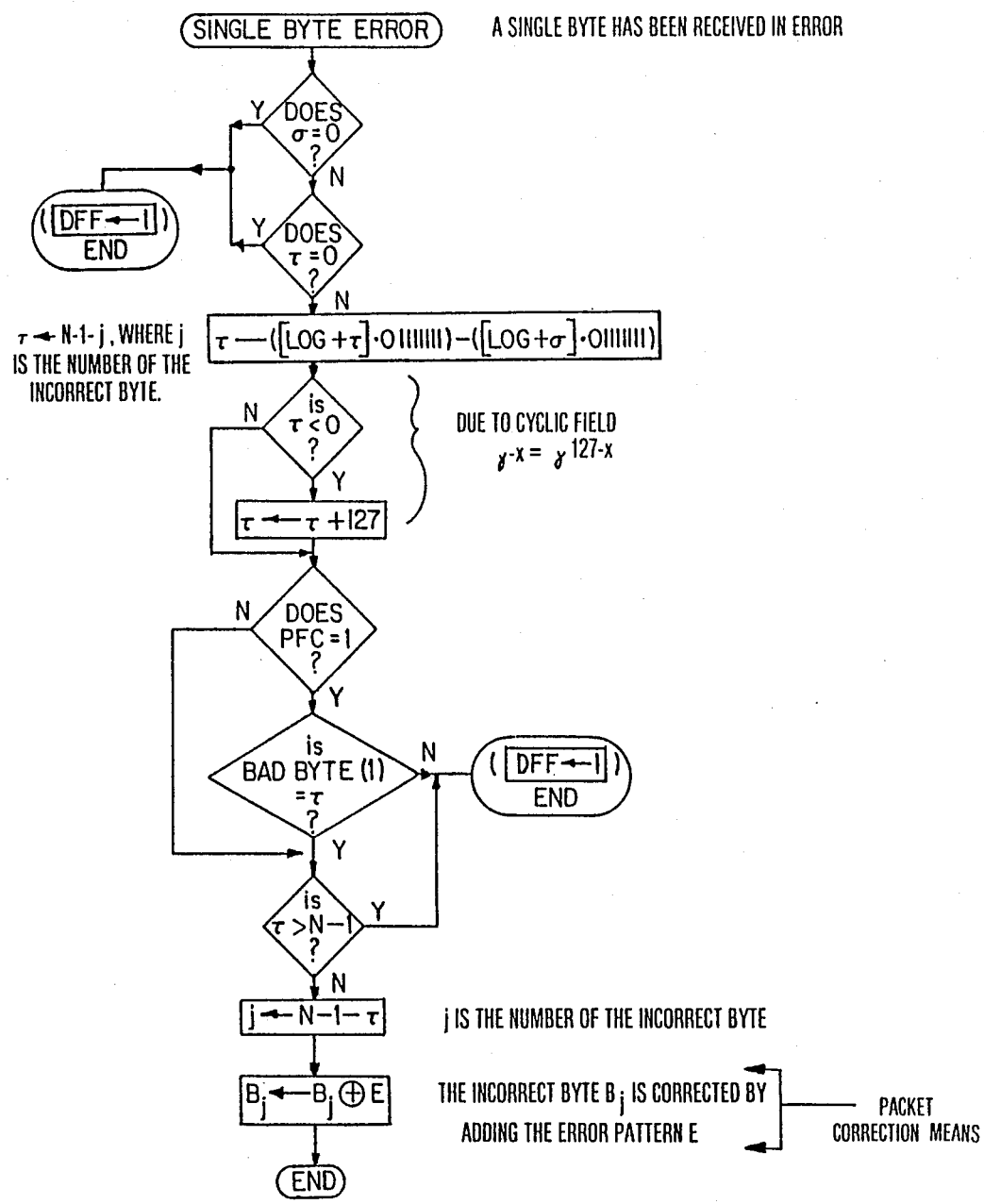

The microprocessor of the decoder, using the memory table PARITY, tests each byte, $B_i$, of a data block for parity error and stores, in a one dimensional memory array named BAD BYTE(X), the value N-1-i. This value is used to determine the value i of the byte $B_i$ having incorrect parity. For example, if bytes $B_4$ and $B_{10}$ have incorrect parity, then BAD BYTE(1) and BAD BYTE(2) will contain 23 (i.e. 28-1-4) and 17 (i.e. 28-1-10), respectively. The number of occurrences of detection of bytes having incorrect parity is counted by a counter named PFC which may be simply a working register of the microprocessor. Thus, the microprocessor also provides byte-parity-error identification means to permit the identification of two bytes of the data block to be decoded having incorrect parity.

Where only one parity-incorrect byte is identified, (i.e. if PFC is 0 or 1), the data block is operated upon according to the steps of the flowchart section "SINGLE BYTE ERROR" (FIG. 4c). The value j of the incorrect byte $B_j$, is determined by the difference of the logarithms of the values $\tau$ and $\sigma$ (i.e. which effectively divides these two values) the result of which difference is N-1-j. The values $\tau$ and $\sigma$ are determined according to relationships (17) and (18) for $\sigma'$ and $\tau'$, respectively. The byte $B_j$ is then corrected by the microprocessor by adding the bit error pattern $e_j$ to the byte $B_j$.

Figure 4D:
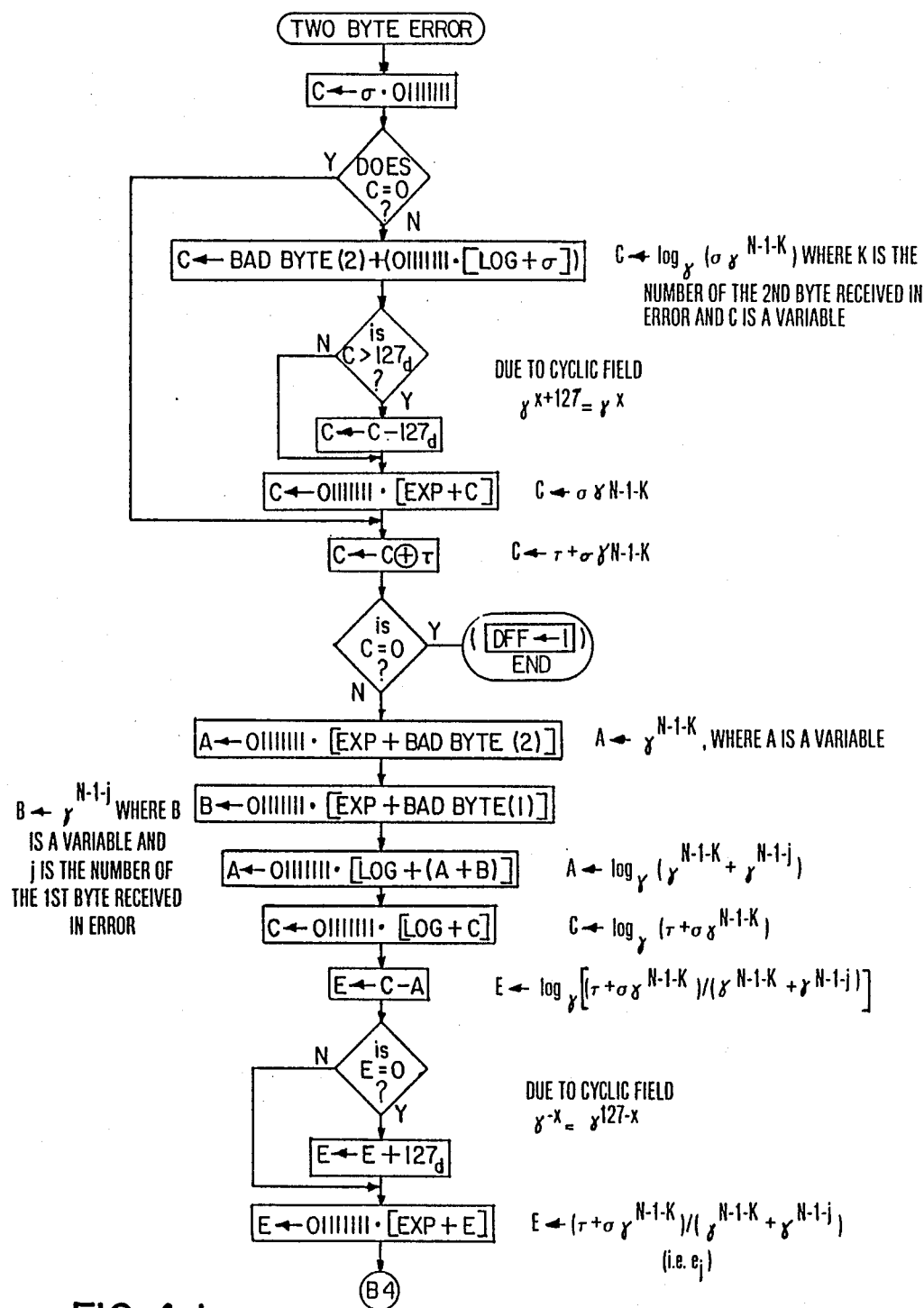
Figure 4E:
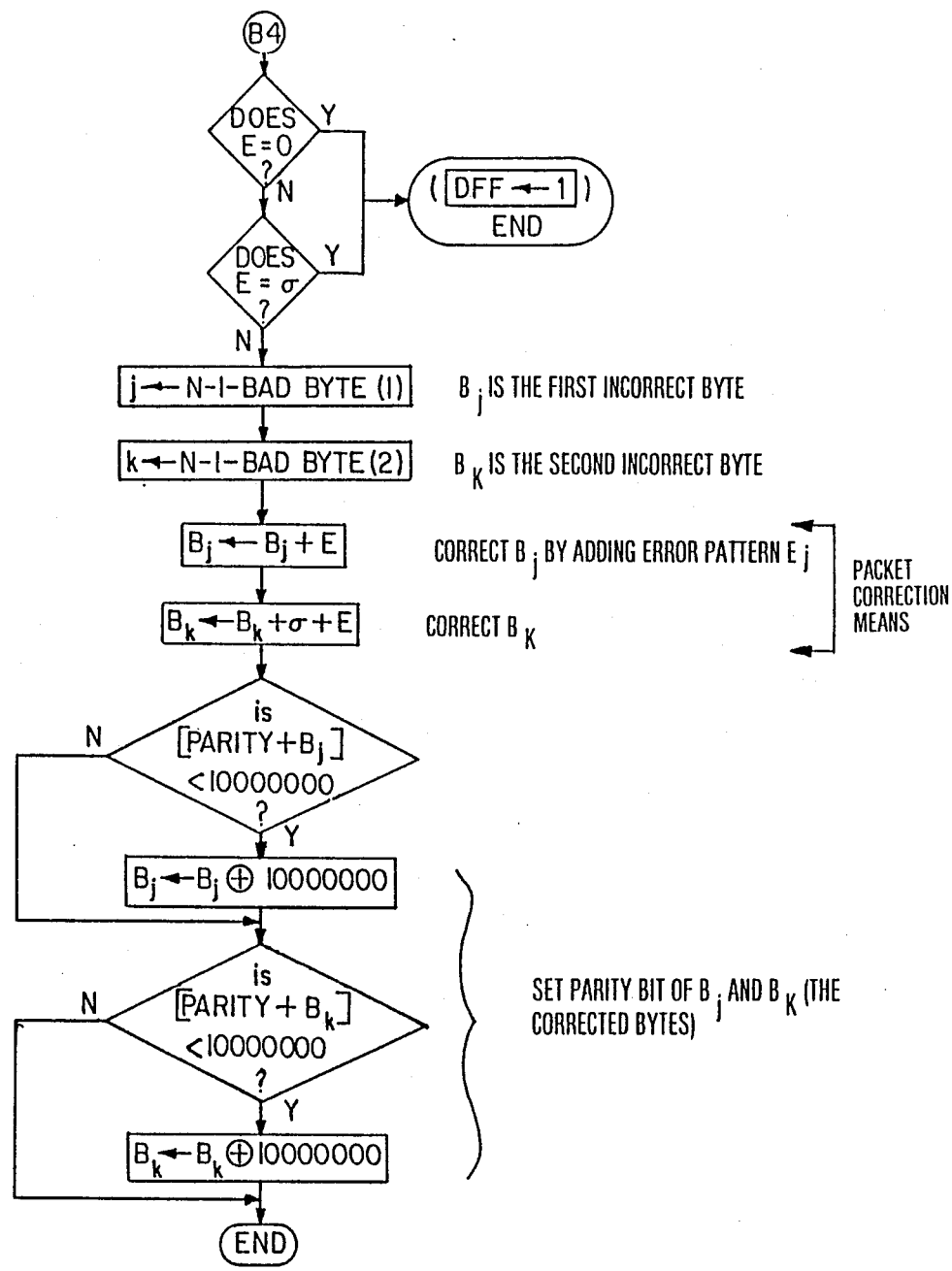

If two parity-incorrect bytes are identified (i.e. if PFC is equal to two) the data block is operated upon according to the steps of the flowchart section "TWO BYTE ERROR" (FIGS. 4d, 4e). The bit error patterns $e_j$ and $e_k$, defined by relationships (21) and (22) above, are determined by appropriate operations using logarithms and exponentials to multiply and divide bytes as required. The values j and k of incorrect bytes $B_j$ and $B_k$, respectively, are the values identified by the byte-parity-error identification means and stored in memory locations BAD BYTE(1) and BAD BYTE(2). The data bits of incorrect bytes $B_j$ and $B_k$ are corrected by the microprocessor by adding to them the bit error patterns $e_j$ and $e_k$, respectively. The corrected bytes $B_j$ and $B_k$ are then parity encoded by the microprocessor (the most significant bit being the parity bit) using the look-up table PARITY in the manner described above.

This completes the discussion of encoding and decoding means for data blocks. The following describes the methods and apparatuses of the present invention to encode and decode bundles of data blocks.

Data Block Bundle Encoder

As discussed above, there are two possible modes of bundle coding, namely, a first mode which uses 1 code block for vertical data block encoding and a second mode which uses 2 code blocks for vertical data block encoding. Of course, the advantage associated with the first mode is that a lesser amount of redundancy results (since fewer code bytes are transmitted) and this enables a higher data transmission rate. However, if a greater degree of redundancy than that occurring from the first mode is acceptable, the second mode may be preferred because it provides greater error correction capability. To illustrate this, consider the case of a burst of errors running over a sequence of two data blocks i.e. two rows of the bundle (see FIGS. 1 and 2 for example).

If the first mode is selected each vertical data block, comprising two columns of data bytes, contains 4 bytes in error (i.e. 2 bytes per horizontal data block and 2 bytes per column) which exceeds the correction capability of Code C (which is capable of correcting up to 2 bytes per encoded data block). Therefore, the bytes in error cannot be corrected upon decoding the vertical data blocks of the bundle. Note though that the first mode can correct one completely missing or erroneous data block (assuming that there are no errors occurring elsewhere in the bundle) since, in such case, each vertical data block contains only two bytes in error (i.e. one in each of the two columns of a vertical block).

In the case of two completely missing or erroneous data blocks, if the second mode of bundle coding is selected the two data blocks can be regenerated or corrected respectively upon vertical decoding. By the second mode of bundle coding each vertical data block comprises one column only of data bytes and each of the two code bytes are located in that column, each in a separate horizontal code block. Therefore, each vertical data block contains only two bytes in error (assuming that no errors occurred in the vertical block other than the two bytes of the missing or erroneous data blocks) and those bytes can be regenerated or corrected upon decoding the vertical block. Thus, the one-code-block bundle coding mode is capable of regenerating one completely missing (horizontal) data block but is incapable of regenerating two completely missing (horizontal) data blocks. However, the two-code-block bundle coding mode is capable of regenerating one or two completely missing (horizontal) data blocks. Depending upon the application, one mode may be preferable over the other.

For the bundle encoder described herein the bundle format of the first mode of bundle coding conforms to FIG. 1, described above. That is, each horizontal data block contains 28 bytes consisting of 26 data bytes (e.g. $B_0$ to $B_{25}$) and 2 code bytes (e.g. $B_{26}$ and $B_{27}$) Each vertical data block comprises two columns of the bundle array and contains 2(h-1) data bytes and 2 code bytes each of which is in code block h.

Figure 5A:
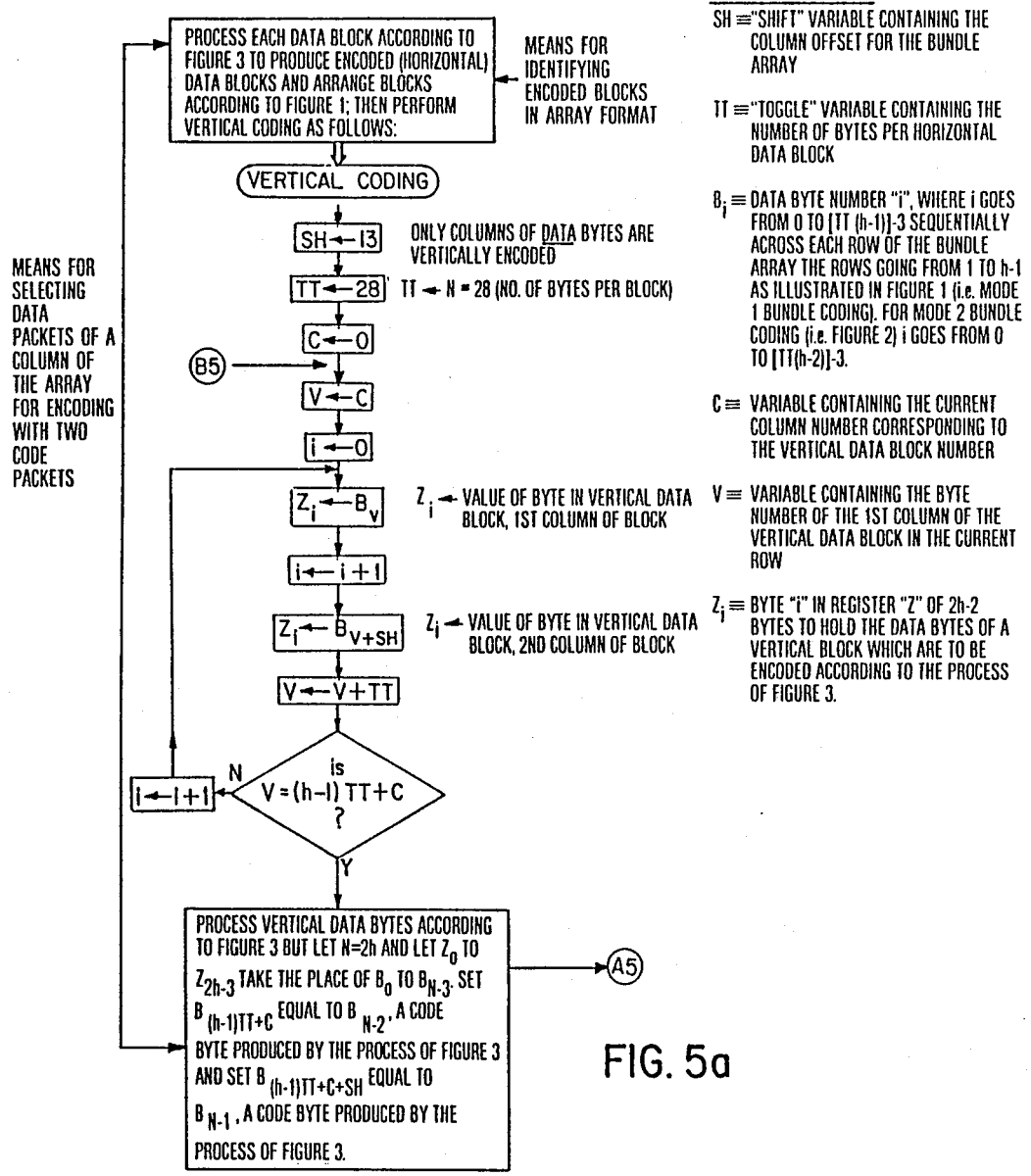
FIGS. 5a and 5b (referred to collectively herein as "FIG. 5") illustrates, in flowchart form, a process for encoding a bundle of data blocks with one code block, the arrangement of bytes of the bundle, for coding, being the arrangement of FIG. 1.
Figure 5B:
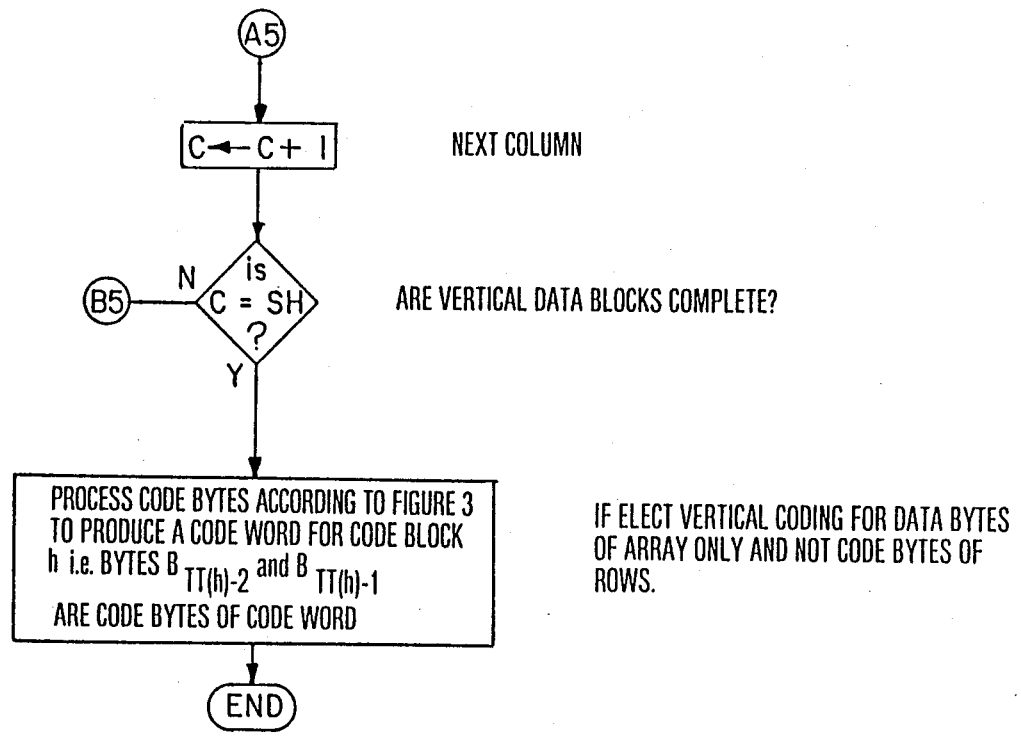

The flowchart of FIG. 5 illustrates, by way of example, a sequence of operations which may be performed by a microprocessor to encode a bundle of data blocks using one code block (i.e. mode 1). The microprocessor identifies the data blocks to be bundle encoded such that each data block is identified as a row of the bundle array. A variable C (which may be a register of the microprocessor) counts the columns of the bundle array and a variable SH stores the offset between the two columns of each vertical data block. All data bytes in one vertical data block are selected from the bundle array and processed by the microprocessor according to the flowchart of FIG. 3 discussed above to produce an encoded vertical data block. However, the number of data bytes so processed is not N-2 as for horizontal encoding, but instead is 2(h-1) (i.e. the number of data bytes comprising 2 columns of h-1 rows of data blocks). Each pair of columns of data bytes, numbers 0 and 13, 1 and 14, etc. to 12 and 25, is encoded with two code bytes according to the steps of the flowchart of FIG. 3, the last byte of each one of the pair of columns (i.e. in row h) being one of the two code bytes for the vertical data block. The code bytes of row h are also encoded with two code bytes according to the steps of the flowchart of FIG. 3, the 27th and 28th bytes of row h being the two code bytes for the code block itself. If instead of encoding the horizontal code block h with two code bytes it is desired to vertically encode the two columns of code bytes of the horizontal data blocks, the variable (i.e. register of the microprocessor) SH is let to equal 14 instead of 13 and the last step (i.e. before "end") is omitted from flowchart FIG. 5b.

If two code blocks are used for bundle encoding i.e. the second mode, the bundle format conforms to FIG. 2 described above. That is, each horizontal data block contains 28 bytes consisting of 26 data bytes (e.g. $B_0$ to $B_{25}$) and 2 code bytes (e.g. $B_{26}$ and $B_{27}$) Each vertical data block comprises one column of the bundle array containing h-2 data bytes and 2 code bytes located in code blocks h-1 and h.

Figure 6:
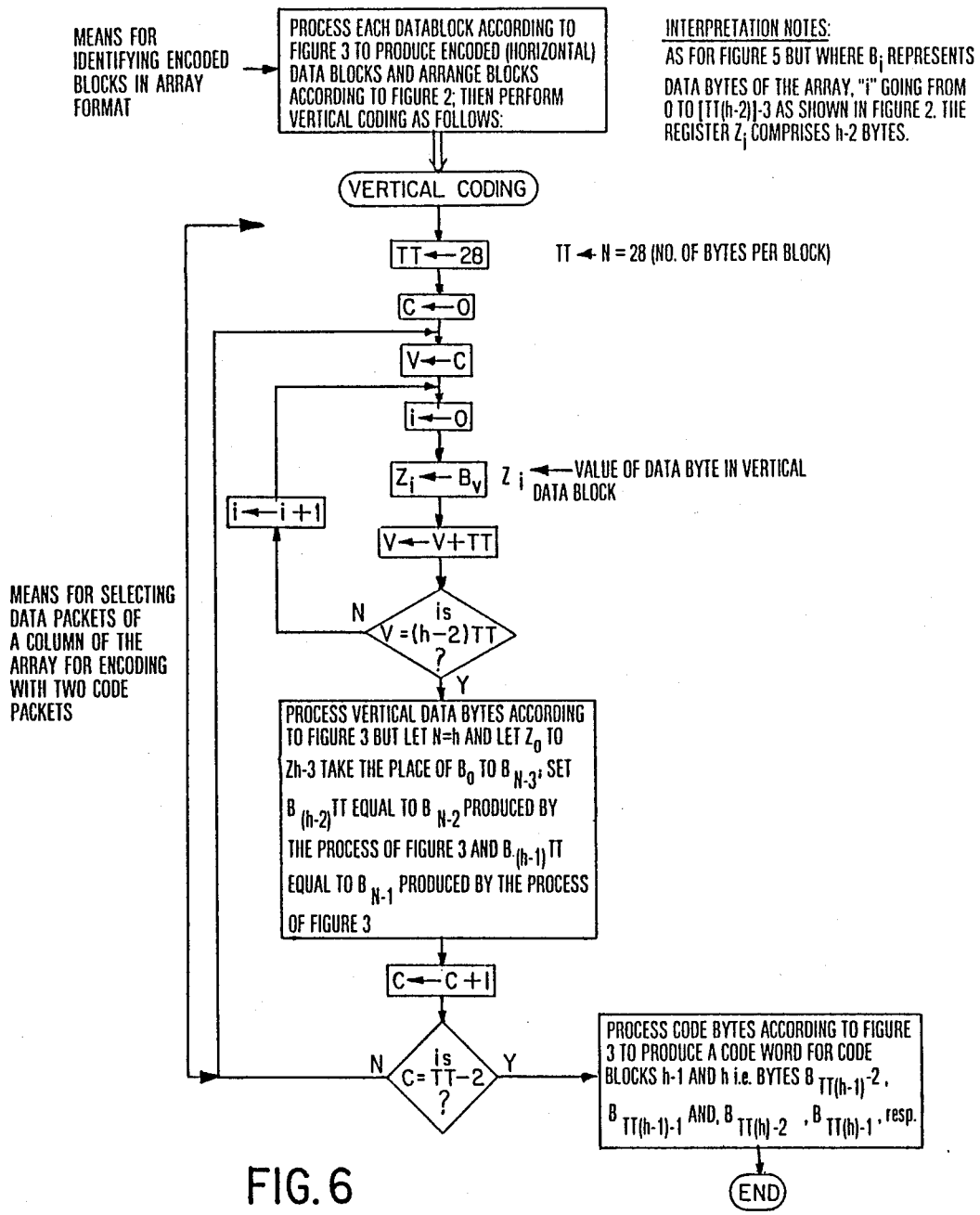
FIG. 6 illustrates, in flowchart form, a process for encoding a bundle of data blocks with two code blocks, the arrangement of bytes of the bundle, for coding, being the arrangement of FIG. 2.

The flowchart of FIG. 6 illustrates, by way of example, a sequence of operations which may be performed by a microprocessor to encode a bundle of data blocks using two code blocks (i.e. mode 2). The process is essentially the same as that shown in FIG. 5 except that the offset of pairs of data byte columns per vertical data block, by SH bytes, is not necessary since for mode 2 bundle coding only one column of the array is included in each vertical data block. (If vertical coding of the code bytes for the horizontal data blocks is selected the variable C should be let to run to the value TT and the last step (i.e. before "end") should be deleted.)

Data Block Bundle Decoder

Figure 7:
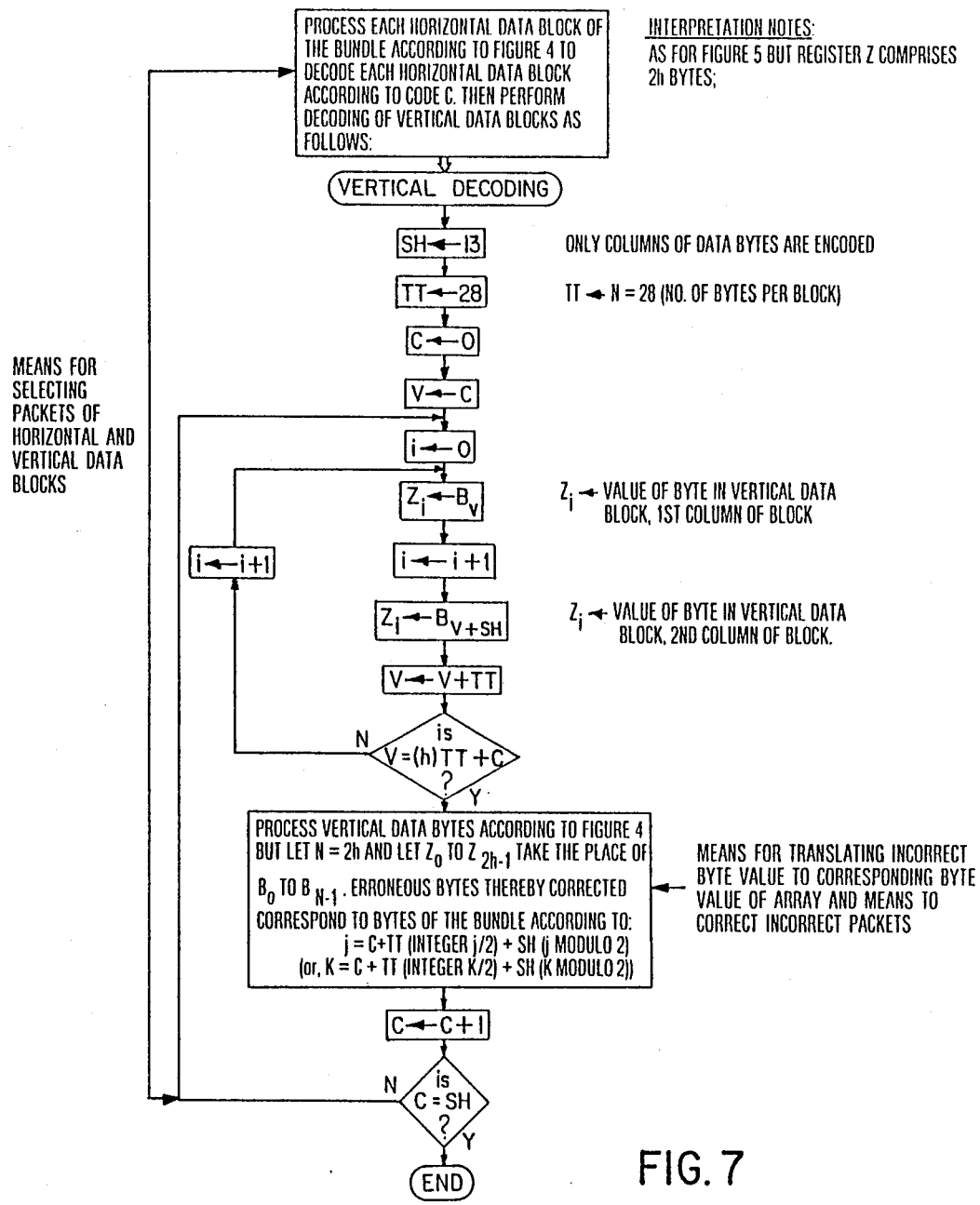
FIG. 7 illustrates, in flowchart form, a process for decoding a bundle of data blocks encoded, according to Code C, with one code block, and correcting incorrect bytes of the bundle as permitted.
Figure 8:
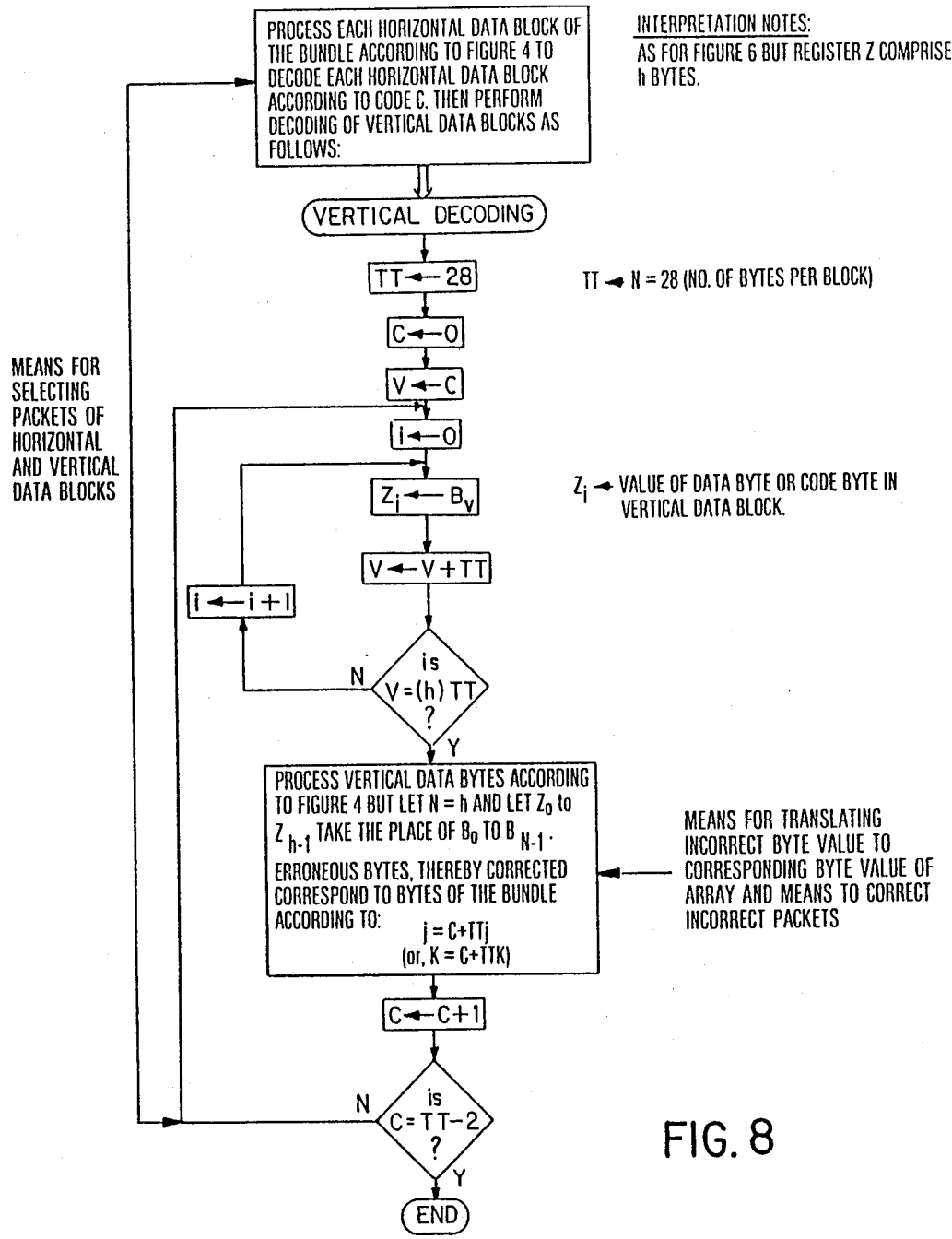
FIG. 8 illustrates, in flowchart form, a process for decoding a bundle of data blocks encoded, according to Code C, with two code blocks, and correcting incorrect bytes of the bundle as permitted.

To decode a data block bundle (encoded according to the above) a microprocessor is, preferably, selected to operate according to the steps illustrated in the flowcharts of FIG. 7 or FIG. 8. The flowchart of FIG. 7 illustrates, by way of example, a sequence of operations to decode a bundle of data blocks encoded with one code block, the bundle conforming to the format illustrated in FIG. 1. The microprocessor identifies each of the horizontal and vertical data blocks of the array to be decoded. Then each byte of a row (i.e. horizontal data block) of the bundle is selected by the microprocessor and decoded according to the above-described sequence of operations illustrated by FIG. 4 to decode a data block. This is then repeated for the next rows of data bytes until all rows have been decoded. Then, each byte of a vertical data block of the bundle is selected by the microprocessor and decoded according to the sequence of operations illustrated by FIG. 4 and this is repeated for each vertical data block until all have been decoded. A variable C (e.g. a register of the microprocessor) counts the columns of the vertical data blocks of the bundle and a variable SH is set to the byte offset between columns of a vertical data block. Since the sequence of operations of FIG. 4 may be conveniently used to also decode each vertical data block (as well as horizontal data blocks), the values j or j and k of the incorrect bytes calculated by this sequence, identifying bytes $B_j$ or bytes $B_j$ and $B_k$, respectively (and error patterns $e_j$ or $e_j$ and $e_k$ respectively), are translated by the microprocessor to the value of the particular bundle bytes which they represent and the bundle bytes are then corrected by adding the resulting bit error patterns to the erroneous bytes of the bundle.

For example, taking the first vertical data block, consisting of bytes $B_0$ and $B13$ of row 1, $B_0$ and $B_{13}$ of row 2, etc., the bytes of the block are identified as bytes $B_0$ to $B_{N-1}$ for the operations identified in FIG. 4 (N denoting the number of bytes in the vertical data block viz. 2h bytes). The bit error patterns are determined for the bytes $B_j$ and $B_k$ being one of the bytes $B_0$ to $B_{N-1}$. To translate the values j and k to values corresponding to bundle bytes the vertical data block column number is added to the integer value of j/2 (i.e. the remainder of j/2 is ignored) multiplied by the number of bytes per horizontal data block (i.e. TT). Then, if j is an odd number the column offset SH is added (i.e. SH (j modulo 2)). By taking the integer value of j/2 multiplied by TT, the rows of the bundle are incremented once every two bytes. This is necessary because bytes $B_j$ and $B_{j+1}$ correspond to bytes of the same row, for example, $B_0$ and $B_{13}$.

The flowchart of FIG. 8 illustrates, by way of example, a sequence of operations to decode a bundle of data blocks encoded with two code blocks (i.e. mode 2), the bundle conforming to the format of FIG. 2. The sequence of operations involved to decode a "mode 2" encoded bundle is essentially the same as that discussed above with respect to FIG. 7, but in the case of mode 2 decoding, the step of shifting 13 columns once for every row is not necessary, since all bytes of a vertical data block are contained in one bundle array column. Therefore, the above-described translation from $B_j$ or $B_k$ to the corresponding bundle byte numbers is also inappropriate for mode 2 bundle decoding.

For the vertical block decoding of the first mode of bundle coding, the number N, identified in the flowchart of FIG. 4, is equal to 2h since each vertical block contains two columns of the bundle array, each column having h rows. For mode 2, N equals h since each vertical data block contains only one column of h rows.

The sequence of operations of both FIG. 7 and FIG. 8 involve one decoding cycle only. That is, horizontal data block decoding is performed first and then vertical data block decoding is performed. However, as discussed above, it may be desirable to perform more than one bundle decoding cycle to increase the number of data bytes corrected upon decoding. If the last performed half cycle of bundle decoding (i.e. vertical or horizontal decoding) results in the correction of one or more bytes, additional corrections may be possible upon performing further decoding cycles. Therefore, it may be desired that the microprocessor performing the bundle decoding also perform a step of counting the number of times horizontal decoding results in a byte (or 2 byte) correction. Likewise, for vertical decoding. Then, if the byte correction counter equals some preselected value when the decoding cycle illustrated in FIG. 7 or FIG. 8 is complete, the microprocessor might trigger the starting of another decoding cycle, or half cycle, to be performed. Further decoding cycles or half cycles might then be repeated as desired, according to the number of byte corrections occurring in the most recently completed half cycle. As stated above, a bundle decoder in accordance with the present invention may be implemented by a variety of operation sequences other than those described above; however, any group of steps which performs equivalently the encoding and decoding methods described herein is considered to come within the scope of the present invention. Depending upon the specific electronic devices selected to perform the described processes some departure from the description provided herein may be appropriate. For example, the architecture of one microprocessor may enable a particular task to be performed by one element of the operating instruction set, while another microprocessor may require several such elements to perform the equivalent task. The particular set of operating instructions to control a given microprocessor, or other equivalently combined arrangement of circuit devices, do not define the present invention, which is defined by the appended claims.

I claim:

1. Encoding apparatus to encode a plurality of parity encoded data packets with two code packets, each of said data packets containing a plurality of data bits and a parity check bit, and each of said code packets comprising a plurality of code bits, to permit the detection and correction of one incorrect packet occurring in said data packets, or two incorrect packets if the two packets are identifiable, comprising processing means for producing said two code packets such that a first sum, using modulo 2 addition, of said data packets and said code packets is equal to zero and a second sum of said data packets and said code packets, at least the data bits and code bits, respectively, of each packet multiplied by a unique Galois field element, is equal to zero, said Galois field comprising elements which may be represented by a number of bits, said number being at least the number of data bits in each of said data packets, said processing means including:
   (i) multiplication means to multiply the data bits of one of said data packets by one of said Galois field elements and summing means to sum by modulo 2 addition pluralities of data bits and pluralities of bits produced by said multiplication means;
   (ii) generating means to produce from the products and summations produced by said multiplication and summing means respectively two code packets conforming to said first and second sums.

2. The apparatus of claim 1 wherein said processing means includes a microprocessor.

3. Decoding apparatus to decode an encoded data block comprising a plurality of parity encoded data packets and two code packets each of said data packets containing a plurality of data bits and a parity check bit, and each of said code packets comprising a plurality of code bits, to detect and correct one incorrect packet occurring in said data packets or two incorrect packets if the two incorrect packets are identifiable, said code packets having been produced from said data packets such that a first sum, using modulo 2 addition, of said data packets and said code packets equaled zero and a second sum of said data packets and said code packets, at least the data bits and code bits, respectively, of each packet multiplied by a unique Galois field element, equaled zero, said Galois field comprising elements represented by a number of bits, said number being at least the number of data bits in each of said data packets, said apparatus comprising (a) processing means for producing one bit-error-pattern packet for one incorrect packet, or two bit-error-pattern packets for two incorrect packets including:
  (i) parity testing means to determine the parity of each of said data packets of said data block;
  (ii) byte-parity-error identifying means to permit identification of at least two packets of said data block determined by said parity testing means to have parity failure;
  (iii) summing means to sum by modulo 2 addition and multiplication means to determine, according to said first and second sums, one bit-error-pattern packet representative of incorrect bits in one incorrect packet or two bit-error-pattern packets representative of incorrect bits in two identifiable incorrect packets; and,
(b) packet correction means to correct one or two of said packets determined to have parity failure using said one or two bit-error-pattern packets respectively.

4. The apparatus of claim 3 wherein said processing means includes a microprocessor.

5. Data block bundle encoding apparatus for encoding a number of data packets of a designated two dimensional array of data packets arranged such that the rows of the encoded bundle array are comprised of a number of data blocks each of said blocks comprising a plurality of parity encoded data packets and two code packets, said bundle encoding apparatus comprised according to the apparatus of claim 1 and further comprising:

(a) means to identify a plurality of said encoded data blocks in array format, said data blocks comprising rows of said array; and,
(b) means for selecting the data packets of one or more columns of said array for processing by said processing means to produce two code packets for said data packets of said columns, said code packets and data packets of said column together comprising an encoded vertical data block.

6. Data block bundle decoding apparatus for decoding a number of packets of a designated two dimensional array of packets said array comprising rows of (horizontal) data blocks and columns of (vertical) data blocks each said block comprising a plurality of parity encoded data packets and two code packets, said bundle decoding apparatus comprised according to the apparatus of claim 3 and further comprising:

(a) means for selecting in turn the packets comprising each of said horizontal or vertical data blocks for processing each said data block separately by said processing means to produce one bit-error-pattern packet for one incorrect packet occurring in said selected packets of a data block or two bit-error-pattern packets for two incorrect packets occurring in said selected packets of a data block, said incorrect packets identified by said byte-parity-error identification means to have incorrect parity;
(b) means for translating a value identified by said byte-parity-error identifying means identifying one or two incorrect packets of said selected packets to a value identifying the corresponding one or two incorrect packets of said array of horizontal and vertical data blocks; and,
(c) means to correct said corresponding one or two incorrect packets of said array using said one or two bit-error-pattern packets produced by said processing means.

7. The apparatus of claim 6 including:
(a) counting means to count the number of packets of one or more of said horizontal or vertical data blocks which have been corrected using said bit-error-pattern packets; and,
(b) trigger means to direct said bundle decoding apparatus to repeat the decoding of said horizontal data blocks or vertical data blocks to correct one or two incorrect packets occurring in one or more of said data blocks if said counting means exceeds a predetermined value.

8. A method of encoding a plurality of parity encoded data packets with two code packets, each of said data packets comprising a plurality of data bits and a parity check bit and each of said code packets comprising a plurality of code bits, to permit the detection and correction of one incorrect packet occurring in said packets, or two incorrect packets if the two packets are identifiable, comprising the step of producing said two code packets such that the sum, using modulo 2 addition, of said data packets and said code packets is equal to zero and the sum of said data packets and said code packets, each packet having been multiplied by a unique Galois field element is equal to zero, said Galois field comprising elements which may be represented by a number of bits, said number being at least 9. A method of encoding a bundle of data blocks comprising a number of data packets of a designated two dimensional array of data packets the packets arranged such that each row of the array is comprised of a data block each of said blocks comprising a plurality of parity encoded data packets and two code packets comprising the steps of selecting the packets of one or more columns of said array and encoding said selected packets with two code packets according to the method of claim 8 to produce an encoded (vertical) data block.

10. A method of decoding a plurality of packets of an encoded data block said data block comprising a plurality of parity encoded data packets and two code packets each of said data packets comprising a plurality of data bits and a parity check bit and each of said code packets comprising a plurality of code bits, to detect and correct one incorrect packet occurring in said data packets or two incorrect packets if the two incorrect packets are identifiable, said code packets having been produced from said data packets such that a first sum, using modulo 2 addition, of said data packets and said code packets equaled zero and a second sum of said data packets and said code packets, at least the data bits and code bits, respectively, of each packet multiplied by a unique Galois field element, equaled zero, said Galois field comprising elements represented by a number of bits, said number being at least the number of data bits in each of said data packets, said method of decoding comprising the steps:

(a) determining the parity of said data packets of said data block;

(b) identifying the one or two packets of said data block having parity failure if one or two packets respectively are determined to have incorrect parity;

(c) producing according to said first and second sums one bit-error-pattern packet for said one incorrect packet or two bit-error-pattern packets for said two identified incorrect packets respectively; and, (d) correcting said one or two incorrect packets using said one or two bit-error-pattern packets respectively.

11. A method of decoding an encoded bundle of data blocks comprising a number of data packets of a designated two dimensional array of packets said array comprising rows of (horizontal) data blocks and (vertical) data blocks each of said blocks comprising a plurality of parity encoded data packets and two code packets, said method comprising the steps of selecting in turn said horizontal and vertical data blocks and decoding each of said selected blocks according to the decoding method of 10.

12. The method of claim 11 including the steps:

(a) counting the number of packets of one or more of said horizontal or vertical data blocks which have been corrected; and, (b) repeating the steps of claim 11 and paragraph (a) herein to decode said horizontal data blocks and/or vertical data blocks until the number of packets counted to have been corrected does not exceed a preselected value.

* * * * *

UNITED STATES PATENT AND TRADEMARK OFFICE
CERTIFICATE OF CORRECTION

PATENT NO. : 4,769,818
DATED : September 6, 1988
INVENTOR(S) : Mortimer

It is certified that error appears in the above-identified patent and that said Letters Patent is hereby corrected as shown below:

Column 20, line 20, after the word "value" please insert the greek symbol -- $\zeta$ --.

Column 26, line 44, after the word "least" please insert the following --the number of data bits in each of said data packets--.

Signed and Sealed this

Eleventh Day of April, 1989

Attest:

DONALD J. QUIGG

Attesting Officer

Commissioner of Patents and Trademarks